United States Patent
Elsherbini et al.

(10) Patent No.: US 11,581,282 B2
(45) Date of Patent: Feb. 14, 2023

(54) SERIALIZER-DESERIALIZER DIE FOR HIGH SPEED SIGNAL INTERCONNECT

(71) Applicant: Intel Corporation, Santa Clara, CA (US)

(72) Inventors: Adel A. Elsherbini, Chandler, AZ (US); Johanna M. Swan, Scottsdale, AZ (US); Shawna M. Liff, Scottsdale, AZ (US); Gerald S. Pasdast, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 1022 days.

(21) Appl. No.: 16/117,353

(22) Filed: Aug. 30, 2018

(65) Prior Publication Data

US 2020/0075521 A1    Mar. 5, 2020

(51) Int. Cl.
    *H01L 23/00*      (2006.01)
    *H01L 23/48*      (2006.01)
    *H01L 21/56*      (2006.01)
    *H03M 9/00*      (2006.01)
    (Continued)

(52) U.S. Cl.
CPC .............. *H01L 24/09* (2013.01); *H01L 21/56* (2013.01); *H01L 23/481* (2013.01); *H01L 24/03* (2013.01); *H01L 24/80* (2013.01); *H01L 25/0652* (2013.01); *H01L 25/50* (2013.01); *H03M 9/00* (2013.01); *H01L 24/05* (2013.01); *H01L 24/13* (2013.01); *H01L 2224/0401* (2013.01); *H01L 2224/05009* (2013.01); *H01L 2224/05124* (2013.01); *H01L 2224/05144* (2013.01); *H01L 2224/05147* (2013.01); *H01L 2224/09177* (2013.01); *H01L 2224/09181* (2013.01); *H01L 2224/09183* (2013.01); *H01L 2224/1357* (2013.01); *H01L 2224/13124* (2013.01); *H01L 2224/13144* (2013.01); *H01L 2224/13147* (2013.01); *H01L 2224/13155* (2013.01); *H01L 2224/13564* (2013.01); *H01L 2224/13624* (2013.01); *H01L 2224/13644* (2013.01); *H01L 2224/13647* (2013.01); *H01L 2224/80801* (2013.01); *H01L 2224/80895* (2013.01); *H01L 2224/80905* (2013.01); *H01L 2924/014* (2013.01)

(58) Field of Classification Search
None
See application file for complete search history.

(56) References Cited

U.S. PATENT DOCUMENTS

| | | | |
|---|---|---|---|
| 6,628,679 B1 * | 9/2003 | Talarek | H04J 3/047 370/536 |
| 7,535,957 B2 * | 5/2009 | Ozawa | H03L 7/113 348/530 |
| 9,436,250 B1 * | 9/2016 | Wortman | H03K 19/1737 |

(Continued)

FOREIGN PATENT DOCUMENTS

WO    WO2018004756     *   3/2017

*Primary Examiner* — Nishath Yasmeen
(74) *Attorney, Agent, or Firm* — Akona IP PC

(57) ABSTRACT

In embodiments, a semiconductor package may include a first die and a second die. The package may additionally include a serializer/deserializer (SerDes) die coupled with the first and the second dies. The SerDes die may be configured to serialize signals transmitted from the first die to the second die, and deserialize signals received from the second die. Other embodiments may be described and/or claimed.

8 Claims, 14 Drawing Sheets

(51) Int. Cl.
    *H01L 25/065*       (2006.01)
    *H01L 25/00*        (2006.01)

(56) References Cited

U.S. PATENT DOCUMENTS

| | | | | |
|---|---|---|---|---|
| 10,566,982 | B1* | 2/2020 | Vercesi | H03L 7/099 |
| 2009/0052218 | A1* | 2/2009 | Kang | H01L 25/18 |
| | | | | 365/51 |
| 2011/0196997 | A1* | 8/2011 | Ruberg | G06F 13/4282 |
| | | | | 327/156 |
| 2015/0113495 | A1* | 4/2015 | Shapiro | H01L 25/50 |
| | | | | 716/122 |
| 2015/0287672 | A1* | 10/2015 | Yazdani | H01L 23/3107 |
| | | | | 257/774 |
| 2019/0198083 | A1* | 6/2019 | Biswas | H01L 25/0652 |

* cited by examiner

SERIALIZER-DESERIALIZER DIE FOR HIGH SPEED SIGNAL INTERCONNECT

BACKGROUND

Many modern applications may require wide bus (e.g., 1000+ signal) interconnects between chips. The large number of signals may drive the bump pitch between the dies used in the interconnects, as well as the pitch of connections between the dies and the package. In legacy packages, the bump pitch may be on the order of approximately 20 to 30 micrometers ("microns" or "µm") for die-to-die interconnects. The die-to-package interconnect pitch may be on the order of approximately 80 to 100 microns. As a result, for 1000 signals, the area needed on a die to accommodate pitches of this scale may be on the order of approximately 10 millimeters squared ($mm^2$) for a 100-micron pitch and approximately 0.9 $mm^2$ for a 30-micron pitch.

As technology advances, the number of signals needed for the bus may increase. For example, the bus may need to be able to enable higher data rates, wider data bus memory, etc. As a result, the area needed to send all of the signals off the die may proportionally increase. In legacy package, this increase may result in larger die sizes (And thus higher cost); added latency due to the longer distances the signals may have to travel across the die and to fan out with relatively high resistive-capacitive (RC)-delay lines; and higher power requirements because the signals may need to be re-clocked if the travel long enough distances.

DETAILED DESCRIPTION

Figure 1:
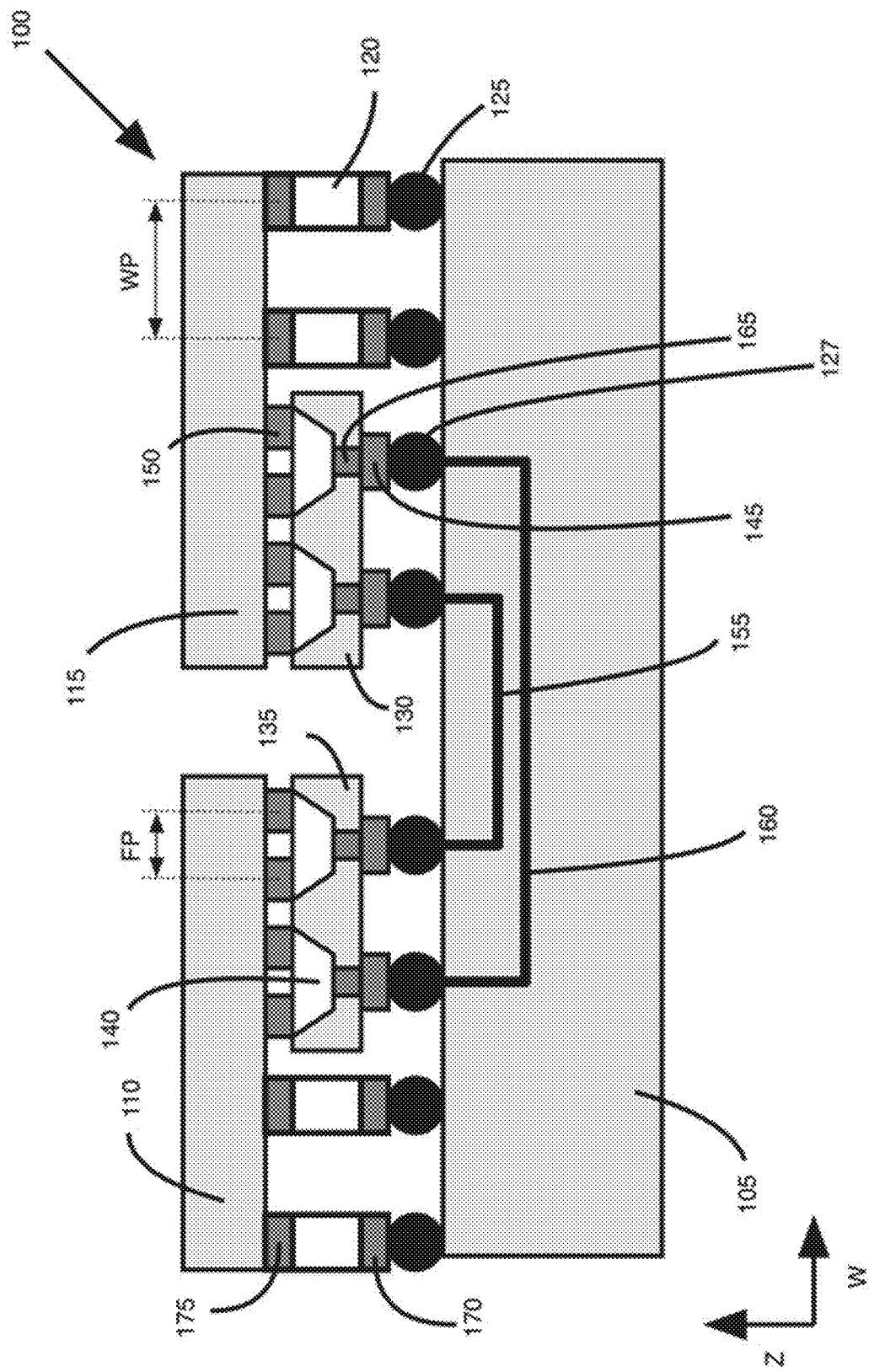
FIG. 1 depicts a simplified view of an example package that may include a serializer/deserializer (SerDes) die, in accordance with various embodiments.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense.

For the purposes of the present disclosure, the phrase "A or B" means (A), (B), or (A and B). For the purposes of the present disclosure, the phrase "A, B, or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or elements are in direct contact.

In various embodiments, the phrase "a first feature formed, deposited, or otherwise disposed on a second feature," may mean that the first feature is formed, deposited, or disposed over the feature layer, and at least a part of the first feature may be in direct contact (e.g., direct physical or electrical contact) or indirect contact (e.g., having one or more other features between the first feature and the second feature) with at least a part of the second feature.

Various operations may be described as multiple discrete operations in turn, in a manner that is most helpful in understanding the claimed subject matter. However, the order of description should not be construed as to imply that these operations are necessarily order dependent.

Embodiments herein may be described with respect to various Figures. Unless explicitly stated, the dimensions of the Figures are intended to be simplified illustrative examples, rather than depictions of relative dimensions. For example, various lengths/widths/heights of elements in the Figures may not be drawn to scale unless indicated otherwise.

Generally, as used herein, "die" is used as a generic term unless otherwise stated. "Die" may refer to a monolithic silicon or other semiconductor die, a fan-out or fan-in die package, a die stack, a wafer-level chip scale package (WLCSP), etc. The die stack may be, for example, a wafer stack, a die stack, or some other stack.

As noted, legacy devices with increased bus size may suffer from a number of undesirable results such as larger die sizes, added latency, or higher power requirements. As a result, it may be desirable to have a smaller pitch to reduce the die area, power requirements, or bus latency. However, the bump pitch may be limited by constraints such as ease-of-assembly, reliability, or technology availability.

Embodiments herein relate to a new approach for die stacking that may allow decoupling SerDes IP blocks from the rest of the integrated circuit. Specifically, the SerDes blocks may be implemented as ultra-thin chiplets on a die, and attached at very fine pitch. These types of connections may be possible due to the planarity and the similar mechanical properties between the various dies that are coupled to one another. The other side of the SerDes die may escape at a larger pitch, allowing a simpler high yield assembly. The active side of the SerDes die may be facing the main die, and the back-side connection may be done by through-silicon-vias (TSVs) or some other type of double-sided interconnects.

Embodiments herein may provide a number of advantages. For example, embodiments may allow sending very wide bandwidth signals between two dies at low latency, with reduced power requirements and minimal die area. Embodiments may decouple the high speed SerDes from the rest of the die. This decoupling may allow using optimized die process technology for the logic/memory die, and optimized high speed or radio frequency (RF) process technology for the SerDes. Also, by connecting the SerDes to the main die at ultra-fine pitch, the signal routing on the main die may be minimized, thus further reducing the signal latency and clocking power requirements of the main die. Finally, in some arrangements, very low parasitics may exist and thus extremely high data rates may be possible due to the relatively short channel between the dies. These high data rates may allow the use of a much smaller area on the die while still sending data at desirable high rates.

Generally, in the descriptions of various Figures herein, it will be understood that each and every element will not be enumerated for the sake of clarity of the Figure. However, unless explicitly indicated, it may be assumed that similar elements share similar characteristics. Additionally, it will be understood that the Figures are intended as simplified examples, and may not necessarily accurately depict relative dimensions of elements within the Figures. In other words, unless specifically stated, relative heights/widths/lengths/etc. of elements should not be presumed from the dimensions shown in the Figures. Additionally, it will be understood that certain elements, for example a SerDes die or some other element, may include additional features such as TSVs or some other feature that may not be explicitly depicted herein, but which may be recognized by one of skill the art. Finally, it will be understood that the number of elements in a given Figure, unless specifically indicated, is not intended to provide a numerical limitation on real-world embodiments. That is, if a Figure depicts only two elements, other embodiments may have more or fewer of those elements.

FIG. 1 depicts an example of a package 100. The package 100 may include a first die 110 and a second die 115 (collectively, "the dies 110/115") communicatively coupled with a substrate 105. In embodiments, one or both of the dies 110/115 may be monolithic, that is, structured as a single physical unit. One or both of the dies 110/115 may include gallium nitride (GaN), gallium arsenide (GaAs), indium phosphate (InP), or some other material. Additionally or alternatively, as noted above, one or both of the dies 110/115 may be a fan-out or a fan-in packaged die, a composite die, a WLCSP, or some other type of structure. The first die 110 or the second die 115 may be, for example, a processor, a memory, a multi-core processor, or some other type of die or integrated circuit. In some embodiments the first die 110 may be a same type of die as the second die 115, while in other embodiments the first die 110 may be a different type of die from the second die 115. In embodiments, the substrate 105 may be a cored or coreless substrate. The substrate 105 may be formed, for example, of various layers of a dielectric material such as ajimoto build-up film (ABF) with a variety of conductive elements such as traces or vias positioned within the substrate 105. In some embodiments, the substrate 105 may be an interposer (e.g. a passive or active silicon interposer or passive glass interposer), a printed circuit board (PCB), a motherboard, or some other type of substrate. In embodiments, the substrate 105 may be an active or passive substrate. That is, the substrate 105 may include logic elements that may perform some type of processing or alteration of a signal, and therefore be considered an "active" transposer. Alternatively, the substrate 105 may not include logic elements and so may be considered a "passive" transposer.

In embodiments, the dies 110/115 may be coupled directly with the substrate via one or more pillars 120. The pillars 120 may be formed of a conductive material such as copper, gold, aluminum, nickel or some other type of conductive material. Generally, the pillars 120 may have a diameter, as measured for example along the axis "W", of approximately 60% the pitch of the pillars 120. The pitch may be, for example, the distance from the center of one pillar 120 to the center of another pillar. In embodiments, the diameter of the pillars 120 may be between approximately 4 and approximately 140 microns. The pillars 120 may have a z-height as measured along the height axis "Z" that is between approximately 10 and approximately 200 microns. More generally, the z-height of the pillars 120 may be based on the z-height of another die coupled to the package 100 such as SerDes die 135, discussed in greater detail below, as well as any associated interconnects. The pillars 120 may have a variety of cross-sectional shapes such as square, rectangular, circular, oblong, triangular, or some other shape. The shape may be, for example, lithographically defined.

The pillars 120 may be coupled with the dies 110/115 by die-side pads 175. The die-side pads 175 may be formed of a conductive material such as copper, gold, aluminum, or some other type of conductive material. In embodiments, the die-side pads 175 may be elements of the pillars 120 themselves. In other embodiments, the die-side pads 175 may be separate from the pillars 120, but coupled with the pillars 120. In these embodiments, the die-side pads 175 may then be communicatively coupled with pads (not shown for the sake of clarity) of the dies 110/115. In other embodiments, the die-side pads 175 may be pads of the dies 110/115, that is, the die-side pads 175 may be integral pads of the dies 110/115. In this embodiment, the die-side pads 175 may not extend from the face of the dies 110/115 as shown in FIG. 1, but rather may be integral elements of the dies 110/115 so that the portion of the die-side pads 175 that is coupled with the pillars 120 is flush with the face of the dies 110/115. In embodiments, the die-side pads 175 may have a pitch WP between approximately 20 and approximately 200 microns. In this context, pitch may refer to a lateral distance along the width axis W from the center of one pad to another pad.

The pillars 120 may further be coupled with the substrate 105 by a package-side pad 170 coupled with a solder bump 125. The package-side pad 170 may be similar to die-side pad 175. Specifically, the package-side pad 170 may be formed of a conductive material such as gold, copper, aluminum, solder, or some other type of conductive material. In embodiments, the package-side pad 170 may be an element of the pillar 120, or in other embodiments it may be a separate element coupled with the pillar 120. The package-side pad 170, and therefore the pillar 120 and its related structure, may be coupled with the substrate 105 by the solder bump 125. Specifically, the solder bump 125 may provide both structural stability by adhering the die-side pad 170 to the substrate 105, and also provide a communication route between the pillar 120 and a pad of the substrate 105 (not shown for the sake of clarity/lack of clutter in the Figure). In embodiments, the solder bump 125 may be formed of a solder material that may include, for example, lead, copper, tin, bismuth, silver, nickel, cobalt, iron, indium, combinations thereof, or some other solder material.

The package 100 may also include SerDes die 130 and 135. The SerDes die 130/135 may have SerDes circuitry 140, which is explained in greater detail below. Generally, the SerDes circuitry 140 may be configured to receive inputs from a variety of sources and serialize those inputs into a single data stream of serialized data that may be transmitted from the SerDes circuitry 140 to another SerDes die. Conversely, the SerDes circuitry 140 may also be configured to receive a data stream of serialized data and deserialize that data stream to generate a plurality of outputs streams of data that may then be transmitted from the SerDes circuitry 140 to, for example, dies 110 or 115.

In embodiments the SerDes dies 135/130 may be respectively coupled to dies 110/115 by SerDes active-side pads 150, which may at least partially provide a signal pathway between the SerDes dies 130/135 and the dies 110/115. Similarly to pads 170 or 175 described above, the SerDes active-side pads 150 may be formed of a conductive material such as aluminum, copper, gold, or some other conductive material. In embodiments, the SerDes active-side pads 150 may be elements of the SerDes die 135 and be communicatively and physically coupled with pads (not shown for the sake of clarity) of the dies 110/115. In other embodiments, the SerDes active-side pads 150 may be elements of the dies 110/115, and be coupled with one or more pads of the SerDes dies 130/135. In these embodiments, the SerDes active-side pads 150 may be at least partially internal to the dies 110/115 or the SerDes dies 130/135. In other embodiments, the SerDes active-side pads 150 may be intermediary elements such as a solder bump, a dual-sided pad, a conductive metallic pad, or some other element positioned between the SerDes dies 130/135 and the dies 110/115. In embodiments, the SerDes active-side pads 150 may have a pitch FP between approximately 5 and approximately 150 microns. More specifically, the pitch FP of the SerDes active-side pads 150 may be smaller than the pitch of the die-side pads 175.

The SerDes dies 130/135 may include a number of TSVs 165 that are communicatively coupled with SerDes back-side pads 145. The TSVs 165 may be plated vias that provide a communicative pathway through the SerDes dies 130/135 between the SerDes circuitry 140 and the SerDes back-side pads 145. The TSVs 165 may be formed of, for example, gold, copper, aluminum, tungsten, or some other conductive material.

Similarly to SerDes active-side pads 150, the SerDes back-side pads 145 may be formed of a conductive material such as copper, gold, aluminum, or some other conductive material. In embodiments the SerDes back-side pads 145 may be elements of the SerDes dies 130/135. In these embodiments, the SerDes back-side pads 145 may be at least partially internal to the SerDes dies 130/135. In other embodiments, the SerDes back-side pads 145 may be separate elements that are coupled with the SerDes dies 130/135 as described above. The SerDes back-side pads 145 may be coupled with solder bumps 127, which may be similar to solder bumps 125.

In some embodiments, the substrate 105 may include one or more vias and vias and traces, as mentioned above. Specifically, the substrate 105 may include vias and traces that form signal pathways 155 and 160. The signal pathways 155 and 160 may be communicatively coupled, via pads (not shown for the sake of clarity) of the substrate 105 and solder bumps 127, with the SerDes dies 130/135. In operation, this coupling may allow the dies 110 and 115 to efficiently communicate with one another with a relatively high data rate, a relatively low power requirement, and reduced latency as compared to legacy die-to-die interconnect solutions. Specifically, die 110 may send a plurality of data signals, via SerDes active-side pads 150, to SerDes die 135, where the plurality of data signals may be serialized into a single data stream which is then transmitted via signal pathways 155 and 166 to SerDes die 130. The single data stream may then be deserialized by SerDes die 130 and the plurality of streams may be output to die 115. The same operation may then occur in reverse.

Figure 2:
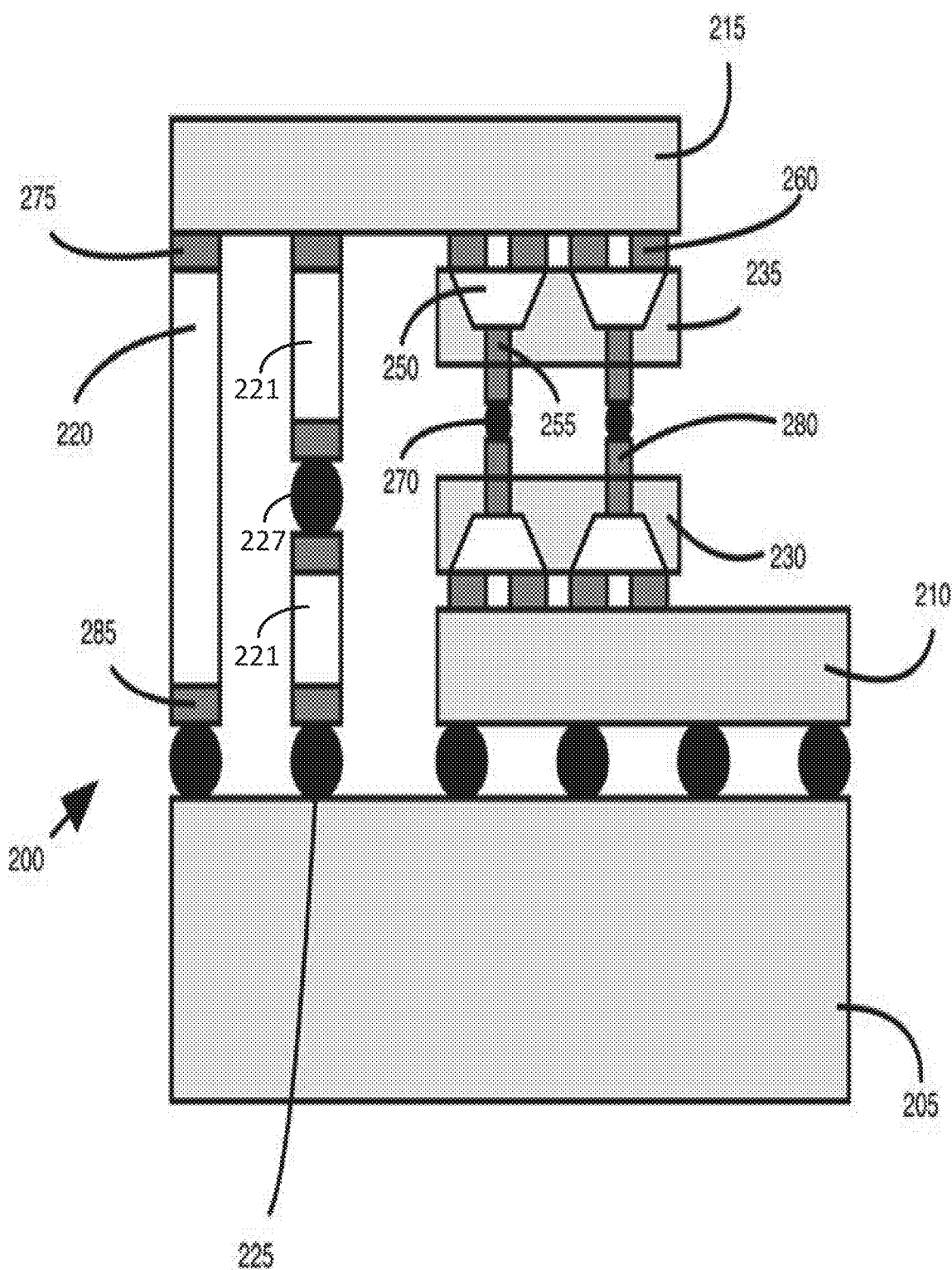
FIG. 2 depicts a simplified view of an alternative example package that may include a SerDes die, in accordance with various embodiments.

FIG. 2 depicts an alternative package 200 that may use SerDes dies to communicate with one another in a manner that gains one or more of the advantages above. Specifically, the package 200 may include a substrate 205, which may be similar to substrate 105. The package 200 may further include a die 215, which may be similar to die 115. The die 215 may be coupled with substrate 205 via die-side pads 275, pillar 220, substrate-side pads 285, and solder bumps 225, which may be respectively similar to die-side pads 175, pillar 120, package-side pads 170, and solder bumps 125. The package 200 may include two SerDes dies 230 and 235, which may be similar to SerDes dies 130 and 135. Specifically, the SerDes dies 230 and 235 may include SerDes circuitry 250 and a TSV 255, which may be respectively similar to SerDes circuitry 140 and TSV 165.

In some embodiments, the pillar 220 may be a unitary pillar as shown in FIG. 2. In other embodiments, the pillar may be a combination of two or more pillars such as pillars 221, with a solder bump 227 coupling them together. Specifically, pillars 221 may each be similar to pillar 220, and solder bump 227 may be similar to solder bump 225. In some embodiments, the pillars 221 may further include pads (not labeled for the sake of clarity) positioned between the pillars 221 and solder bump 227 as shown in FIG. 2. In embodiments, each of the pillars of the package 200 may be a unitary pillar such as pillar 220, a combination of pillars such as pillars 221, or some combination thereof.

In this embodiment, the package may include another die 210 which may be, for example, a processor, a memory, or some other type of die. Die 210 may be what is considered a dual-sided die, in that it has couplings on either side of the die. For example, the die 210 may be configured to couple with the substrate 205 via solder bumps 225 at a first side of the die. The die 210 may further be configured to couple, at a second side of the die 210 opposite the first side, with SerDes die 230 by way of SerDes active-side pads 260. SerDes active-side pads 260 may be similar to SerDes active-side pads 150.

As can be seen in FIG. 2, SerDes die 230 and SerDes die 235 may be inverted from one another. In this arrangement, the back-side of SerDes die 230, that is, the side with TSV 255, may be generally facing the back side of SerDes die 235. The front-side of SerDes die 230, that is, the side closest to SerDes circuitry 250, may be facing die 210. Similarly, the front-side of SerDes die 235 may be facing die 215. In this embodiment, SerDes die 230 may be coupled with SerDes die 235 by a communicative coupling between a SerDes back-side pad 280 of die 230 and a SerDes back-side pad 280 of die 235. Specifically, the SerDes back-side pads 280 may be coupled by solder bump 270, which may be formed of a material similar to that of solder bumps 125 or 225. In other embodiments, the SerDes back-side pads 280 may be coupled directly with one another via some other physical coupling that may provide both structural stability and a direct communication path between the two back-side pads 280. In some embodiments, one or both of the back-side pads 280 may be missing and one or both of SerDes die 230 or 235 may be coupled directly with the solder bump 270 or directly with one another.

In some embodiments, SerDes die 230 may be between approximately 5 and approximately 30 microns from SerDes die 235 along the z-height axis Z. This distance may be considered an "ultra-short" channel, and may allow low parasitics and data rates higher than approximately 100 Gigabit/second/interconnect. As a result, the lateral area of the SerDes dies 230 and 235, that is the area in a plane perpendicular to the z-height axis Z, may be smaller than it would otherwise be in legacy die-to-die interconnects.

FIGS. 3-6 depict different example configurations by which a SerDes die may be used in a package. It will be understood that these implementations are intended as a non-exhaustive list of example embodiments. Further, the embodiments shown in FIGS. 3-6 may be used to replace elements of packages 100 or 200. For example, one of the embodiments shown in FIGS. 3-6 may take the place of die 110 and SerDes die 135, die 115 and SerDes die 130, die 215 and SerDes die 235, or die 210 and SerDes die 230 in a manner that would be readily understood by one of skill in the art. Further, as the internal components of the SerDes dies have been discussed in previous Figures, and will be discussed in greater detail below, these elements will not be repeated again in the discussion of FIGS. 3-6 for the sake of brevity and lack of redundancy.

Figure 3:
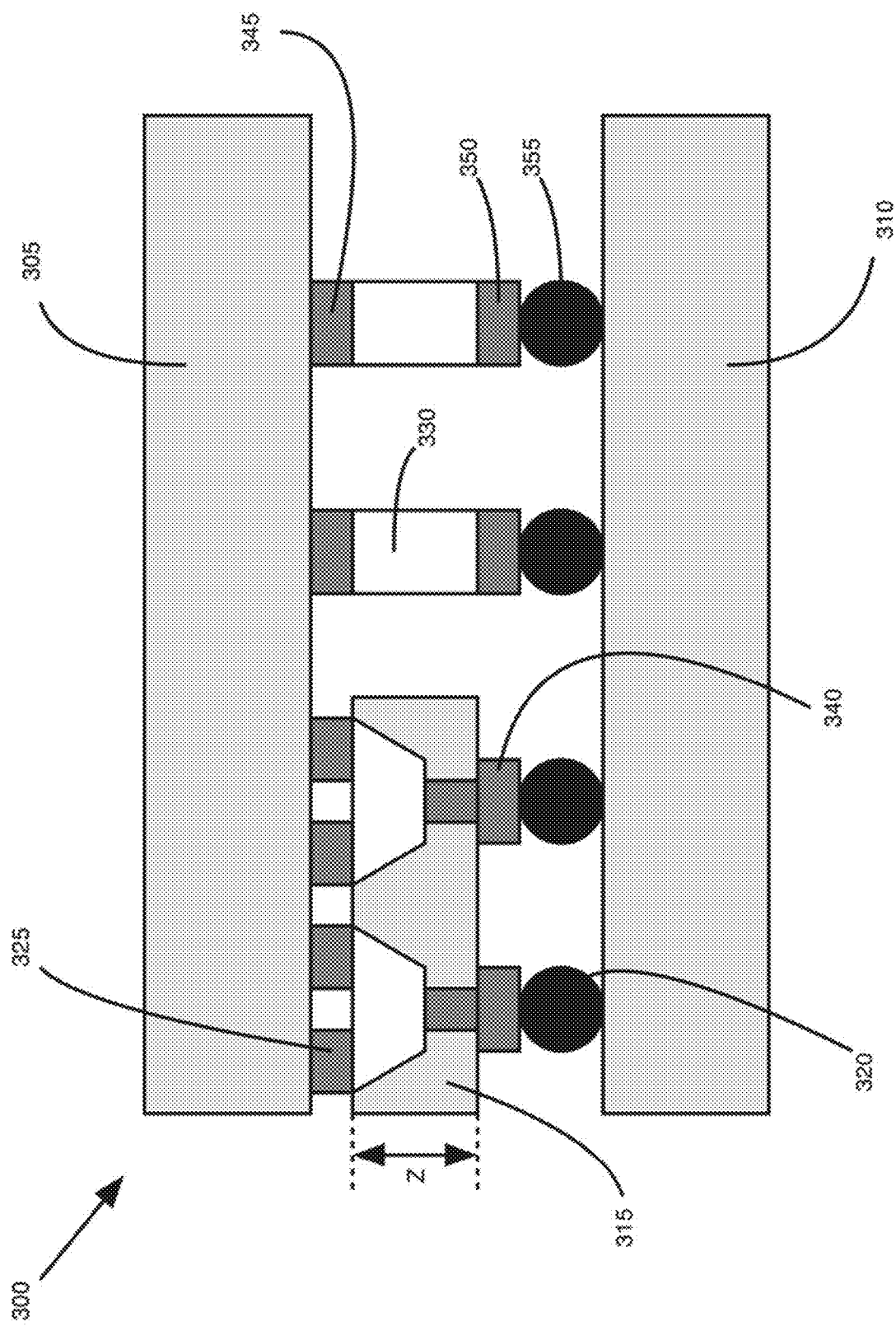
FIG. 3 depicts a simplified view of an alternative example package that may include a SerDes die, in accordance with various embodiments.

Specifically, FIG. 3 depicts a package 300 that may include a die 305, which may be similar to die 110. Package 300 may further include a substrate 310 which may be similar to substrate 105. Die 305 may be communicatively coupled with substrate 310 by way of die-side pad 345, pillar 330, package-side pad 350, and solder bump 355, which may be respectively similar to die-side pad 175, pillar 120, package-side pad 170, and solder bump 125.

Package 300 may further include a SerDes die 315, which may be similar to SerDes die 135. The SerDes die 315 may be coupled with die 305 by SerDes active-side pads 325, which may be similar to active-side pads 150. Similarly, SerDes die 315 may be coupled with substrate 310 by SerDes back-side pads 340 and solder bumps 320.

In the embodiment depicted in FIG. 3, the SerDes die 315 may have a z-height Z of between approximately 10 microns and approximately 200 microns. In this embodiment, the pillars 330 may be used to provide the connections between the die 305 and the substrate 310.

Figure 4:
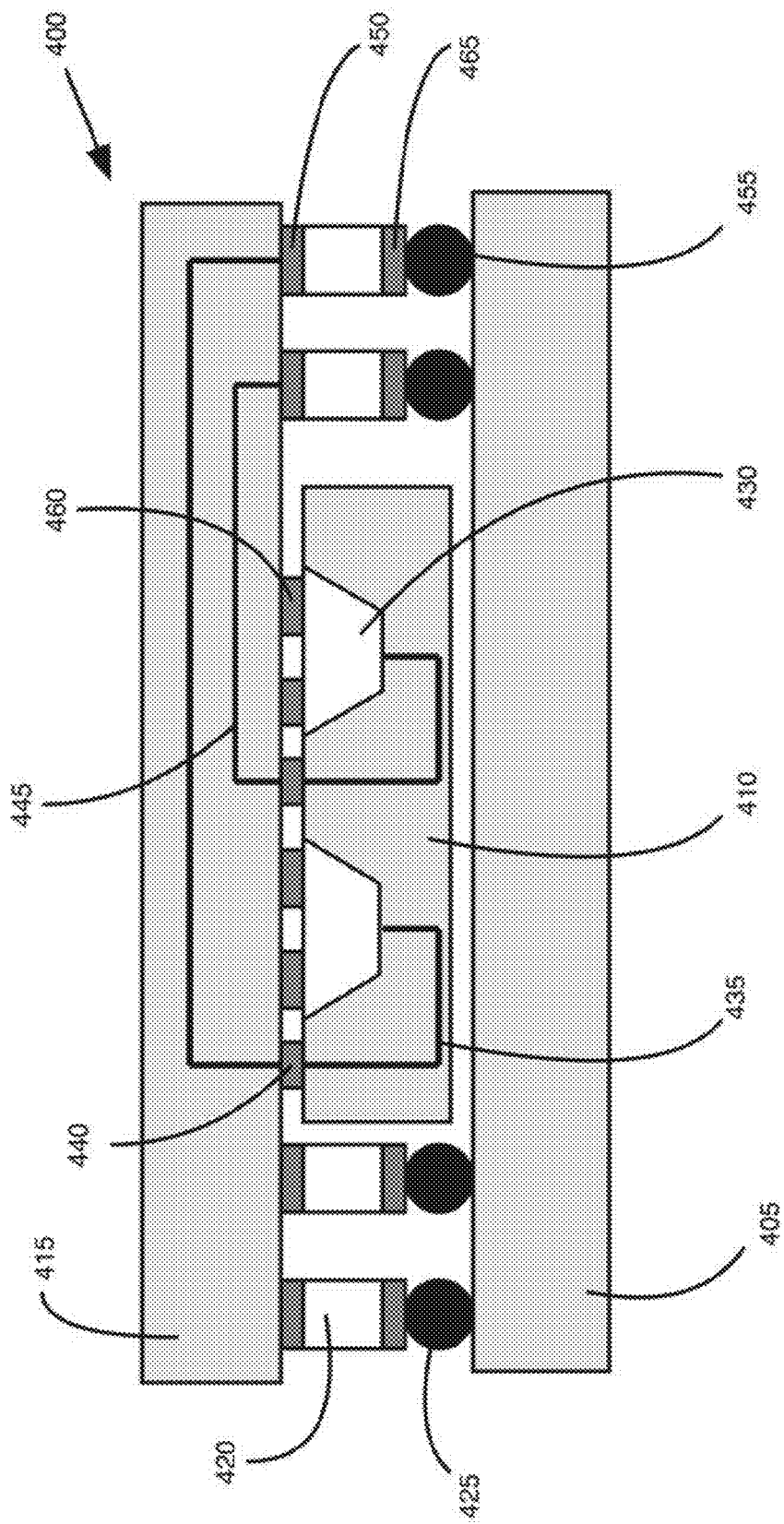
FIG. 4 depicts a simplified view of an alternative example package that may include a SerDes die, in accordance with various embodiments.

FIG. 4 depicts a package 400 wherein the SerDes dies may not have a TSV, but instead may use main die routing lines with the die itself to connect the SerDes die to a substrate. Specifically, the package 400 may include a substrate 405 and a die 415, which may be respectively similar to substrate 105 and die 110. The package 400 may also include die-side pads 450, pillars 420, package-side pads 465, and solder bumps 425/455, which may be respectively similar to die-side pad 175, pillar 120, package-side pad 170, and solder bump 125.

The package 400 may further include a SerDes die 410, which may be generally similar to SerDes die 135, that is coupled to the die 415 via SerDes active-side pads 460 (which may be similar to SerDes active-side pads 150). However, the SerDes die 410 may include some differences from SerDes die 135. Specifically, rather than a TSV such as TSV 165, the SerDes die 135 may have SerDes routing lines 435 coupled with SerDes circuitry 430 (which may be generally similar to SerDes circuitry 140). The SerDes routing line 435 may include a variety of conductive elements such as traces, conductive vias, or some other type of conductive element that allows a signal to be communicated via the SerDes routing line 435 to or from the SerDes circuitry 430.

The SerDes routing lines 435 may couple with an additional SerDes active-side pad 440. The SerDes active-side pad 440 may be similar to SerDes active-side pads 460, but may not be directly coupled with the SerDes circuitry 430 at the active side of the SerDes die. Rather, the SerDes active-side pad 440 may be coupled, either directly or via an additional pad of the SerDes die (not shown for the sake of clarity), with the SerDes routing lines 435.

Additionally, the die 415 may include one or more die routing lines 445. The die routing lines 445 may be similar to SerDes routing lines 435 in that the die routing lines 445 may include one or more traces, conductive vias, or some other type of conductive element that may be capable of actively or passively communicating a signal throughout the die 415. In some embodiments, the die routing lines 445 may be pre-existing elements of the die that may additionally or alternatively be used to communicate signals throughout the die 415 in addition to the SerDes-related signals discussed herein.

The additional SerDes active-side pad 440 may be coupled with the die routing lines 445. The die routing lines 445 may additionally be coupled with one or more of the die-side pads 450 as shown in FIG. 4.

In operation, the package 400 may be seen to be configured to communicate serialized signals generated by the SerDes circuitry 430 based on signals received from the die 415. Specifically, the SerDes circuitry 430 may receive, via SerDes active-side pads 460, one or more signals from the die 415. The SerDes circuitry 430 may generate, based on the received signals, one or more serialized signals which are output to the SerDes routing lines 435. The signals may then be transmitted from the SerDes routing lines 435 to the additional active-side pad 440, to the die routing lines 445, to the die-side pad 450, through the pillar 420, through the package-side pad 465 and the solder bump 455 to the substrate 405. Return signals may then follow the same path in reverse.

It will be understood that the package 400 is intended as an example of this embodiment. In other embodiments, the package 400 may include a plurality of SerDes dies, and one or more of the SerDes dies may only have a single SerDes circuitry. As noted above, the Figures are not intended to be determinative of the specific number of elements herein unless otherwise specifically noted.

Figure 5:
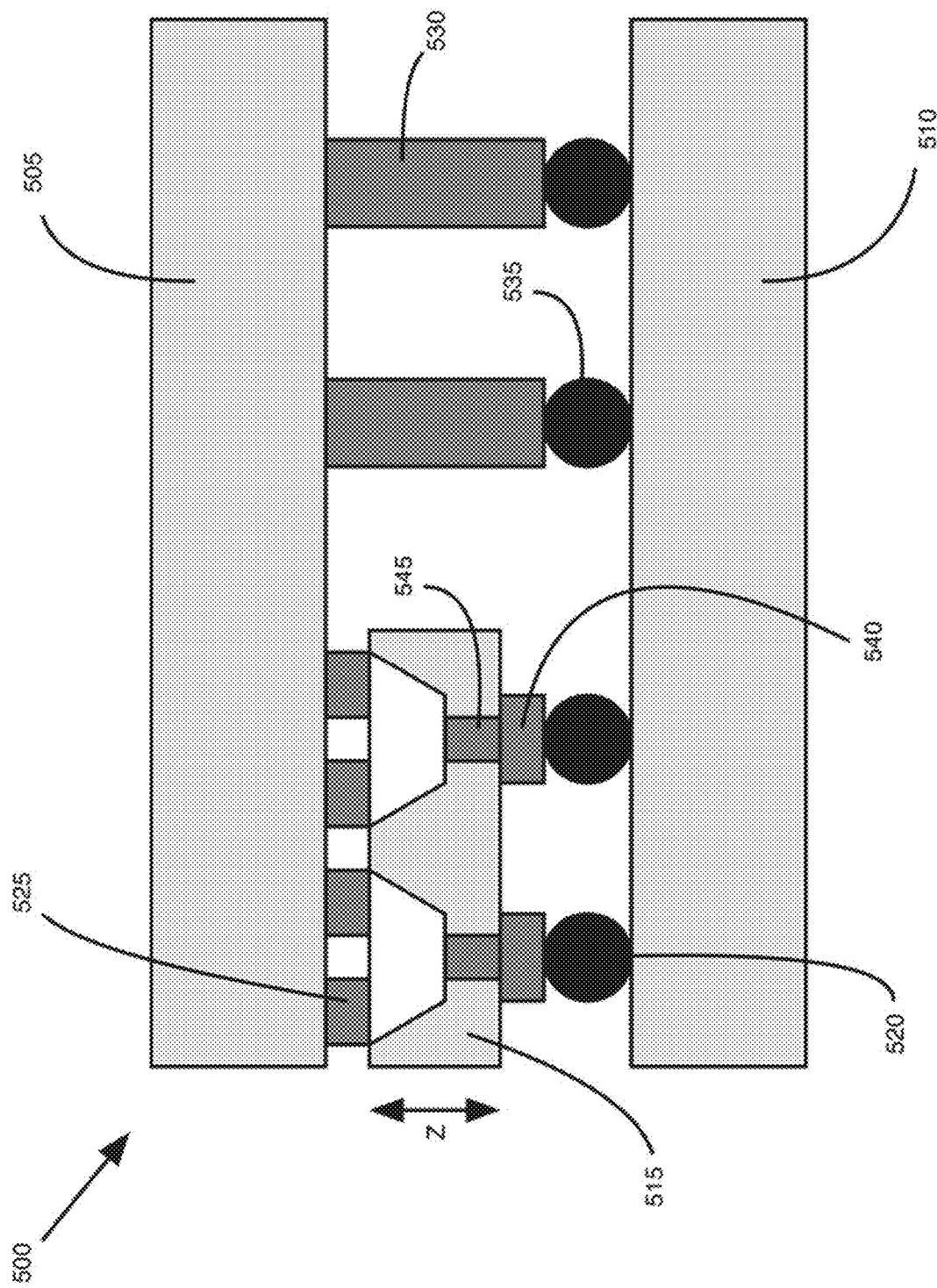
FIG. 5 depicts a simplified view of an alternative example package that may include a SerDes die, in accordance with various embodiments.

FIG. 5 depicts an alternative package 500 wherein the SerDes die may be significantly thinner than the SerDes die depicted in, for example, FIG. 3. In this embodiment, the SerDes die may be buried between pads of the package 500 and so additional pillars such as pillars 330 may not be necessary. It will be understood that this embodiment is not necessarily depicted in FIG. 5 to scale. Rather, certain elements may appear larger or smaller in one or more directions than they would be in a real-world implementation. This change in scale is for the purpose of being able to clearly depict, enumerate, and discuss the various elements of the FIG. 5.

Specifically, the package 500 may include a die 505, a SerDes die 515, and a substrate 510 which may be respectively similar to die 305, SerDes die 315, and substrate 310. The SerDes die 515 may include a TSV 545, which may be similar to TSV 165. The SerDes die 515 The SerDes die 515 may be coupled with the die 505 by SerDes active-side pads 525, which may be similar to SerDes active-side pads 325. The SerDes die 515 may be coupled with the substrate 510 by SerDes back-side pads 540 and solder bumps 520, which may be similar to SerDes back-side pads 340 and solder bumps 320.

In this embodiment, the SerDes die 515 may have a z-height Z of between approximately 10 microns and approximately 20 microns. Because the SerDes die 515 is smaller than SerDes die 315, elements of FIG. 3 such as the pillars 330 may not be necessary. Rather, the die 505 may be directly coupled with substrate 510 by pad 530, which may be similar to die-side pad 345, and solder bump 535, which may be similar to solder bump 335. In some embodiments, the solder bump 535 and the solder bump 520 may have a diameter between approximately 10 and approximately 50 microns, and the pad 530 may have a z-height measured along an axis parallel with the z-height axis Z depicted in FIG. 5 between approximately 15 and approximately 25 microns.

The embodiment of FIG. 5 may in some embodiments require special processing to avoid damaging the relatively thing SerDes die 515. However, the thinner SerDes die 515 may allow for a significantly smaller TSV 545, or some other type of double-sided interconnect, than may be present for example, in SerDes die 315. Specifically, since SerDes die 515 is significantly smaller than SerDes die 315, TSV 545 may also be proportionally smaller than the TSV of SerDes die 315. The smaller SerDes die 515 and TSV 545 may reduce the area needed by TSVs and their associated keep-out zones on the active side of the die or enable double-sided interconnects.

Figure 6:
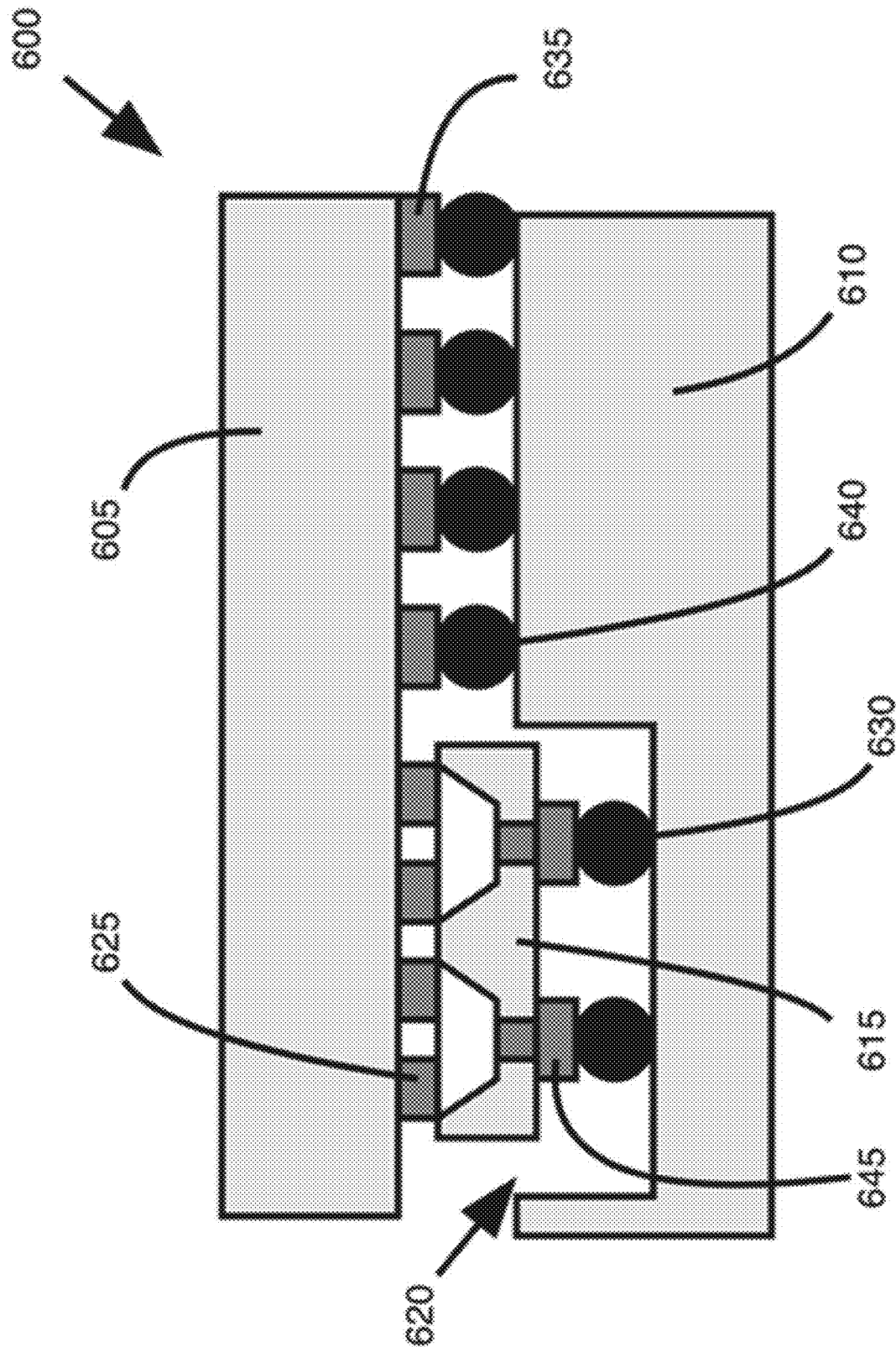
FIG. 6 depicts a simplified view of an alternative example package that may include a SerDes die, in accordance with various embodiments.

FIG. 6 depicts an alternative arrangement wherein the SerDes die may be in a cavity of the substrate. Specifically, FIG. 6 depicts a package 600 that includes a die 605, a SerDes die 615, and a substrate 610, which may be respectively similar to die 110, SerDes die 135, and substrate 105. The SerDes die 615 may be coupled with the die 605 by SerDes active-side pads 625, which may be similar to SerDes active-side pads 150. The SerDes die 615 may also be coupled with the substrate 610 by SerDes back-side pads 645 and solder bumps 630, which may be respectively similar to SerDes back-side pads 145 and solder bumps 127. In this embodiment, the SerDes die 615 may be positioned in a cavity 620 of the substrate 610. In embodiments, the cavity 620 may be formed through a variety of techniques such as mechanical etching, chemical etching, photo-etching, drilling, etc.

In this embodiment, the SerDes die 615 may have a z-height similar to that of SerDes die 315. For example, the SerDes die 615 may have a z-height between approximately 50 microns and approximately 100 microns, which may be measured as shown in FIG. 3. However, because the SerDes die 615 is positioned within cavity 620, the die 605 may be coupled to the substrate 610 without the use of a pillar such as pillars 120. Rather, the die 605 may be coupled to the substrate 610 using a pad 635, which may be similar to pad 530, and a solder bump 640, which may be similar to solder bump 535.

It will be understood that embodiments herein are discussed with respect to solder interconnects such as solder bumps. However, other types of interconnects such as copper-to-copper interconnect, hybrid bonding, conductive adhesives, etc. may be used in other embodiments in addition to, or instead of, the solder bumps.

FIGS. 7-10 depict a sample technique by which elements of a package such as package 100 may be formed. Generally, the descriptions of elements in FIGS. 7-10 may be cumulative in that elements introduced in a Figure may carry through to subsequent Figures without being reintroduced at each subsequent Figure.

Figure 7:
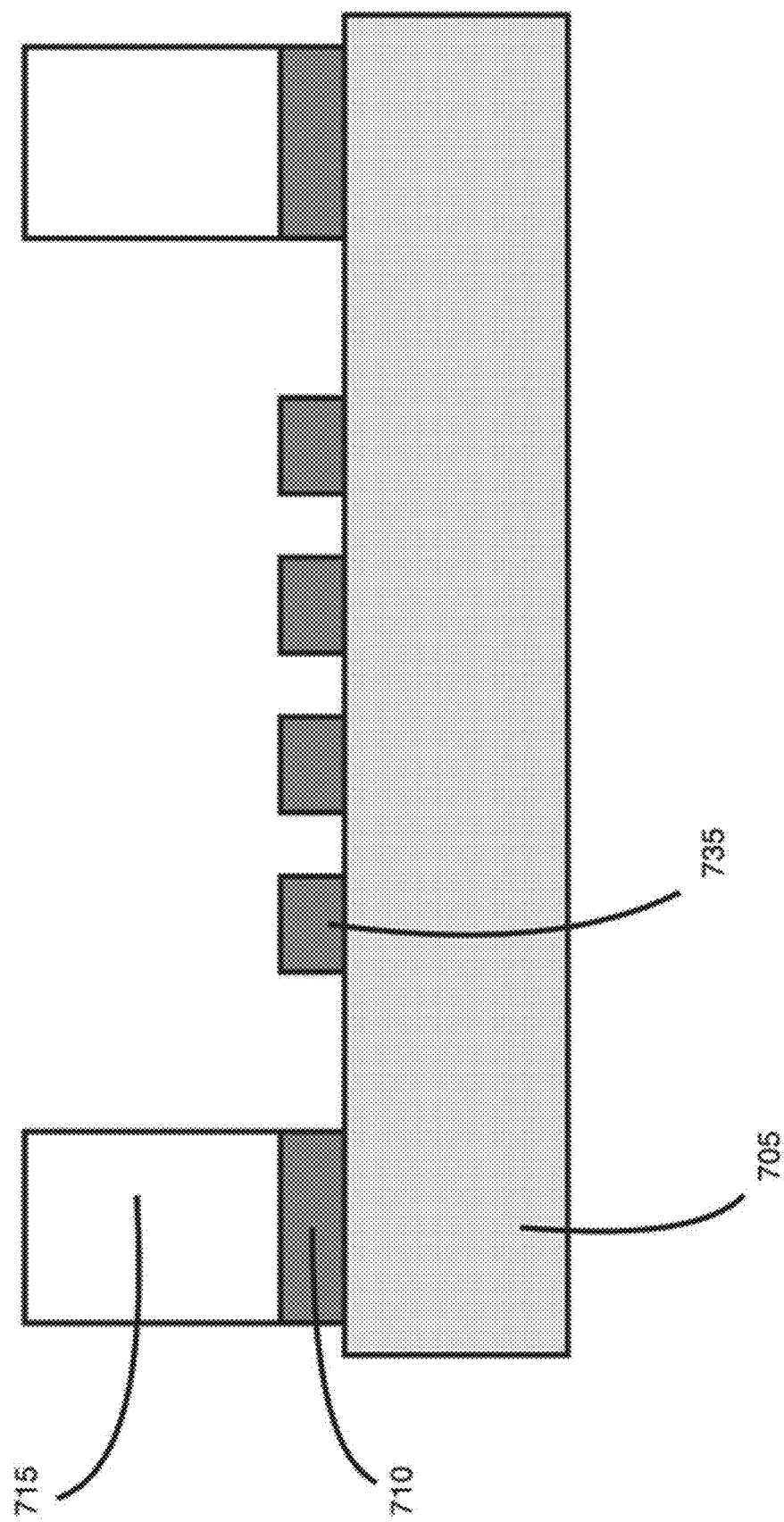
FIG. 7 depicts a simplified view of an example stage of a manufacturing technique that may be used to form elements of the package of any of FIGS. 1-6, in accordance with various embodiments.

As seen in FIG. 7, the technique may begin with a die 705, which may be similar to die 110. Die-side pads 710, which may be similar to die-side pads 175, may be coupled with the die 705. Pillars 715, which may be similar to pillars 120, may be coupled with the die-side pads 710. Additionally, SerDes active-side pads 735, which may be similar to SerDes active-side pads 150, may be coupled with the die 705. In embodiments, the SerDes active-side pads 735 may have a pitch similar to pitch FP of FIG. 1. Die-side pads 710 may have a pitch similar to pitch WP of FIG. 1.

Figure 8:
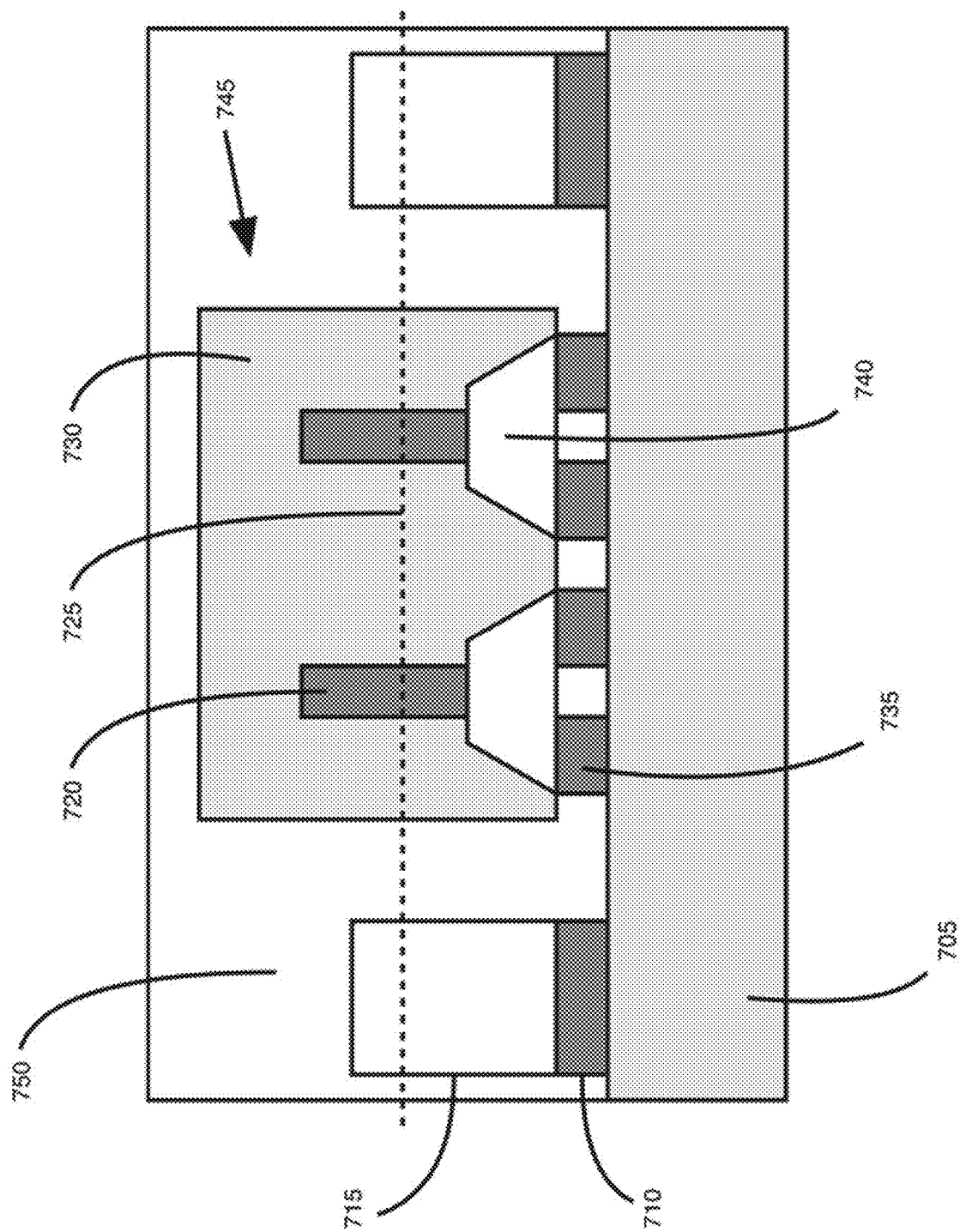
FIG. 8 depicts a simplified view of another example stage of the manufacturing technique of FIG. 7.

As can be seen in FIG. 8, SerDes die 745, which may be similar to SerDes die 135, may be coupled with the SerDes active-side pads 735. Specifically, the SerDes circuitry 740, which may be similar to SerDes circuitry 140, maybe coupled with the SerDes active-side pads 735. The SerDes die 745 may include a substrate material 730 which may be formed of silicon, silicon-on-insulator, gallium nitride, gallium arsenide, indium phosphide or silicon-germanium, or some other semiconductor material. The substrate material 730 may include one or more layers of traces or one or more vias. The SerDes die 745 may also include a TSV 720, which may be similar to TSV 165.

Generally, the SerDes die 745 may be coupled with the die 705 by way of solder attach, copper-to-copper attach, hybrid bonding, or some other means of fine pitch die-to-die interconnect. Because the attach may be done at the wafer level with two relatively thick dies (namely the SerDes die 745 and the die 705), the tolerances for the attach process may be relatively generous which may allow the ultra-fine-pitch attach necessary for the SerDes active-side pads 735.

A dielectric material 750 may then be deposited over the pillars 715, the SerDes die 745, and the face of the die 705 to form an overmold. The dielectric material 750 may be, for example, a permanent photo-resist material, a mold material, a silica filled epoxy resin, a dielectric build-up film, or some other suitable dielectric material. The dielectric material 750 may be disposed through compression or transfer molding, spin coating, slit coating, vacuum lamination, or some other deposition technique.

Figure 9:
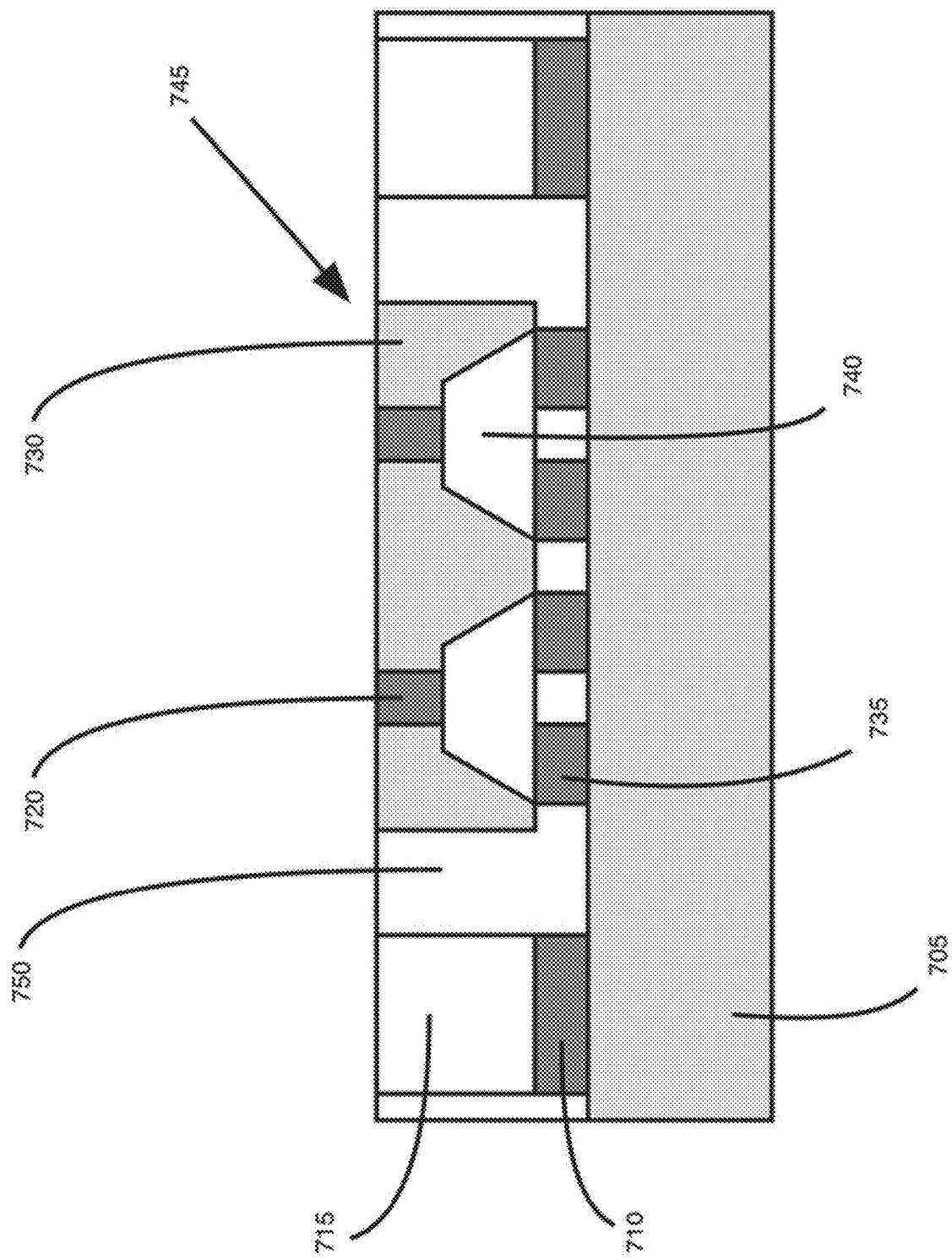
FIG. 9 depicts a simplified view of another example stage of the manufacturing technique of FIG. 7.

As can be seen at FIG. 9, portions of the dielectric material 750, pillars 715, and SerDes die 745 may then be removed until the top of the elements are flush with line 725. The removal process may include a technique such as mechanical grinding, planarization, chemical mechanical polish (CMP), etching, drilling, cutting, debonding, or some other technique where portions of the elements may be removed from the side further from die 705. In some embodiments where planarization may be used, it may be difficult to simultaneously planarize a combination of materials such as silicon (e.g., substrate material 730), copper (e.g., pillars 715 or TSV 720), and a mold material (e.g., dielectric material 750). In these embodiments, the technique may include allowing the TSVs 720 or the pillars 715 to remain protruding above line 725 and planarize other elements such as the substrate 730 or the dielectric material 750.

Figure 10:
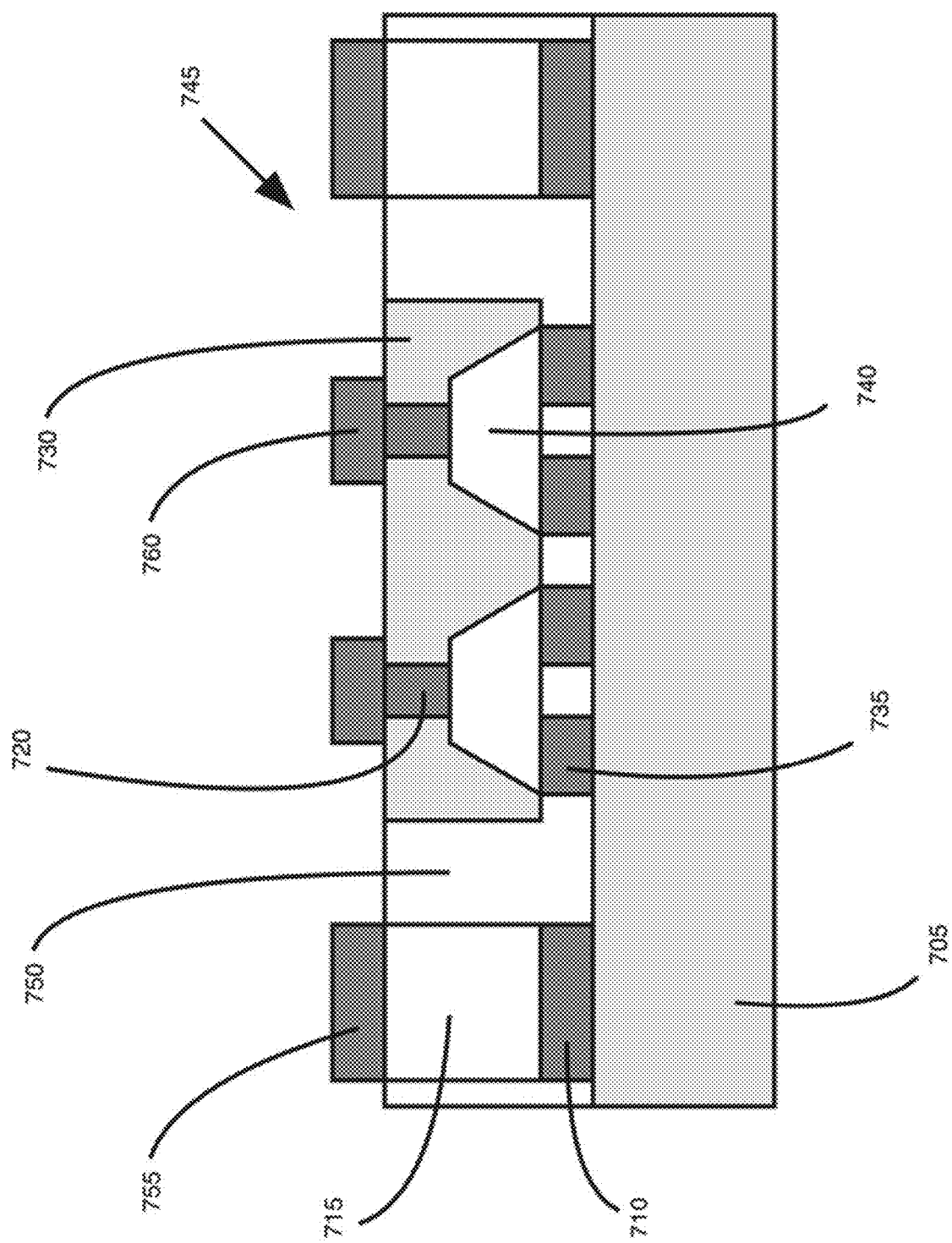
FIG. 10 depicts a simplified view of another example stage of the manufacturing technique of FIG. 7.

As can be seen in FIG. 10, package-side pads 755, which may be similar to package-side pad 170, maybe coupled with pillar 715. Similarly, SerDes back-side pads 760, which may be similar to SerDes back-side pad 145, may be coupled to the SerDes die 745. In embodiments, the package-side pads 755 or the SerDes back-side pads 760 may be considered to be elements of a redistribution layer (RDL). The package-side pads 755 and the SerDes back-side pads 760 may be introduced through, for example, lithographic techniques or some other technique. In some embodiments, solder such as the solder of solder bumps 125 or 127 may be plated to the package-side pads 755 or the SerDes back-side pads 760.

Although only a single SerDes die 745 is depicted in FIGS. 7-10, in other embodiments the above-described manufacturing technique may be performed at the wafer level. That is, a plurality of SerDes dies 745 may be coupled to a wafer structure that includes a plurality of dies 705. The wafer structure may then be diced and the processing may be completed (e.g., direct package or interpose attach) to generate a package such as package 100 or some other package.

It will be understood that the technique described with respect to FIGS. 7-10 is intended as only one example, and the technique may be modified as appropriate to generate a structure appropriate to a different package such as packages 200, 300, 400, 500, 600, or some other package. For example, in some embodiments a finished SerDes die may be coupled to the die 705, and then the planarization element may only include planarization of elements such as the pillars or the dielectric material 750. As another example, in some embodiments the pillars 715 may not be present. In some embodiments, the pillars 715 may not be introduced at FIG. 7, but rather may be introduced later. In some embodiments the SerDes die 745 may be structured similarly to SerDes die 410. Additionally, it will be noted that the dielectric material 750 may be present in packages 100, 200, 300, 400, 500, or 600. However, for the sake of clarity and lack of clutter the dielectric material 750 may have been omitted from those Figures. It will also be understood that this technique may applied to reconstituted wafer or panel level approaches such as fan-out wafer-level packaging or fan-out panel-level packaging.

Figure 13:
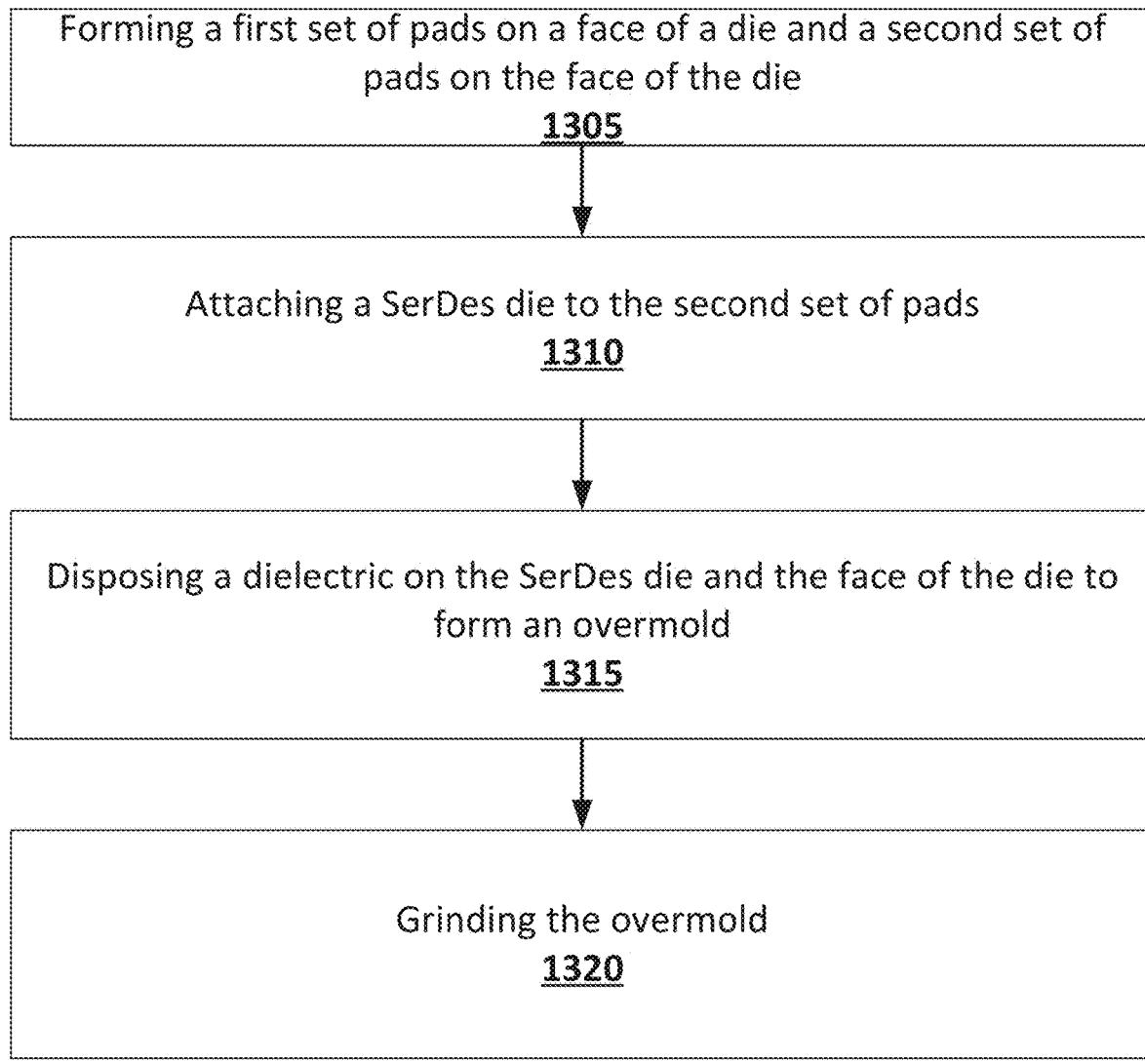
FIG. 13 depicts an overview of the manufacturing technique described in, for example, FIGS. 7-10.

FIG. 13 depicts an example technique by which elements of a package such as package 100 may be formed. Generally, FIG. 13 may be described with reference to FIGS. 7-10. The technique may include forming, at 1305, a first set of pads on a face of a die and a second set of pads on the face of the die. The die may be similar to, for example, die 705. The first set of pads may be, for example, die-side pads 710. The second set of pads may be, for example SerDes active-side pads 735. The technique may further include attaching, at 1310, a SerDes die such as SerDes die 745 to the second set of pads. The technique may further include disposing, at 1315, a dielectric such as dielectric 750 on the SerDes die and the face of the die to form an overmold. Finally, the technique may include grinding, at 1320, the overmold as discussed above with respect to FIGS. 8 and 9. Again, it will be understood that this technique is merely intended as one example, and other embodiments may include variations on the above-described technique based on the specific configurations or use-cases of the packages or SerDes dies. In some embodiments where greater offset is desired, pillars such as pillars 120 or some other pillar may be used in addition to, or instead of, one or more of the pads discussed above with respect to FIG. 13.

In some embodiments, a SerDes die such as SerDes die 135 may transmit and receive baseband signals (i.e., unmodulated signals) that use different line coding. For example, the baseband signals may use non-return-to-zero (NRZ) encoding, return-to-zero (RZ) encoding, four-level pulse-amplitude-modulation (PAM4), eight-level pulse-amplitude-modulation (PAM8), etc. The baseband signals with these different encodings may be useful in high-speed/short-distance signaling such as die-to-die interconnects. The signals may be single-ended or differential signals.

Figure 11:
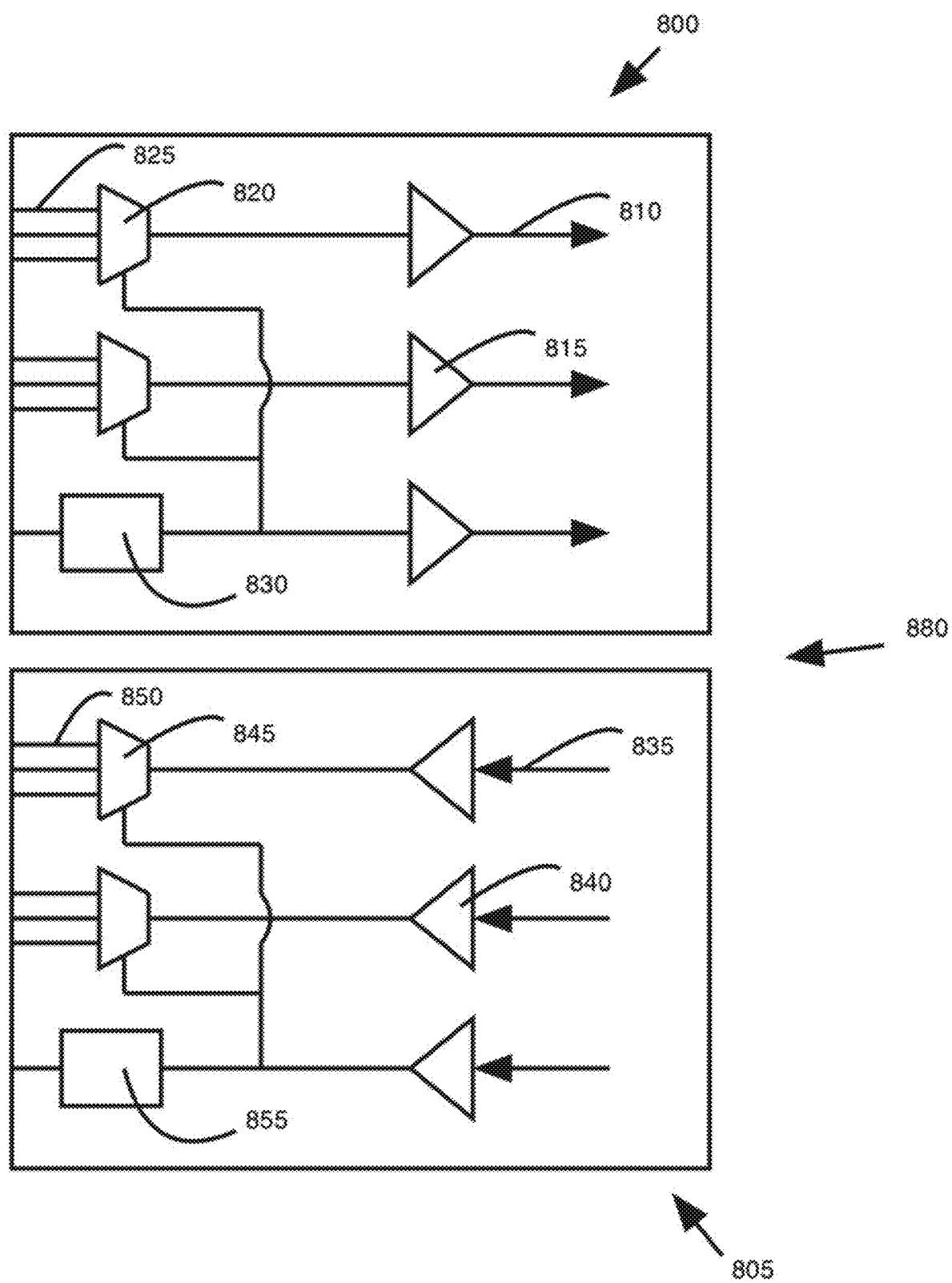
FIG. 11 depicts a simplified view of a circuit design for a SerDes die, in accordance with various embodiments.

FIG. 11 depicts an example of circuitry of a SerDes die 880. The SerDes die 880 may be similar to SerDes die 135 of FIG. 1. Specifically, FIG. 11 depicts a simplified block diagram of the inner wiring of the SerDes die 880.

The SerDes die 880 may include a transmit section 800 and a receive section 805. In some embodiments, the transmit section 800 and the receive section 805 may be implemented as different dies. In other embodiments, the transmit section 800 and the receive section 805 may be implemented as different sections of wiring on a single chip.

The transmit section 800 may include a plurality of input wires 825 coupled with a multiplexer 820. Each of the input wires 825 may be coupled with, for example, a SerDes active-side pad such as SerDes active-side pad 150. The transmit section 800 may further include a clock multiplier 830 configured to provide clock signals to the multiplexers 820. The multiplexers 820 may receive the input signals from the input wires 815 as well as the clock signals from the clock multiplier 830 and combine the input signals to form a serialized signal that includes data from two or more of the input signals. The multiplexers 820 may then output the serialized signals to a driver 815 which may be configured to amplify or otherwise shape the output serialized signals before outputting them to an output line 810. The output line 810 may be coupled with a TSV such as TSV 165.

The receive section 805 may be organized generally opposite of the transmit section 800. Specifically, the receive section 805 may include input lines 835, which may receive one or more serialized signals from a TSV such as TSV 165. The input lines 835 may provide the serialized signals to receivers 840 which may deamplify or otherwise shape the serialized signals. The serialized signals may be output to demultiplexers 845, which may be communicatively coupled with a clock divider 855. The clock divider 855 may be configured to provide one or more clock signals to the demultiplexers 845. The demultiplexers 845 may use the signal from the clock divider 855 to demultiplex the serial signals received from the receivers 840 to form a plurality of deserialized signals which may then be output on output lines 850 to, for example a SerDes active-side pad such as SerDes active-side pad 150.

It will be understood that other embodiments may have one or more variations on the above-described embodiment of the SerDes die 880. For example, in some embodiments it may be possible to directly connect to the demultiplexer without a receiver diagram that includes, for example, the receivers 840. These embodiments may be particularly suited for very short channels with low parasitics, and may help reduce the die area or power needed for the SerDes die.

In some embodiments, the drivers 815 or the receivers 840 may support a low voltage swing. In other words, the drivers 815 or the receivers 840 may operate at a low voltage rather than a control voltage such as Vcc. This low voltage may help reduce the channel power (which may be, for example, a function of capacitance of the element (C), voltage (V), and frequency (f) of the signal on the order of $CV^2f$). However, the use of this voltage may require more complex transmitter or receiver circuitry.

In some embodiments, certain power supply lines such as ground (Gnd) and Vcc may be used between the SerDes die (e.g., SerDes die 135) and a die such as die 110. The regulators for those supplies may exist on the SerDes die, on the main die, or on a different part of the device (e.g. the main package or the main board).

In some embodiments, several control lines may be needed between the die such as die 110 and the SerDes die. The extra control lines may be used, for example, to turn on the SerDes die, turn off the SerDes die, control the data rate of the SerDes die, etc.

In some embodiments, the SerDes die 880 may include internal memory. The internal memory may be, for example, a first-in-first-out (FIFO) buffer or some other type of internal memory or cache. The internal memory may enable testing or handling of higher burst data rates.

In some embodiments, there may be several redundancies built into the SerDes die. The redundancies may allow less than 100% die fabrication or assembly yield. For example, there may be extra data lines that may be used to replace non-working data lines. Some embodiments may have additional latches along the data lines to control the clock skew between the data lines.

Some embodiments may include more complex clocking architectures than those shown in FIG. 11. For example, some embodiments may need clock trees, clock spines, etc.

Figure 12:
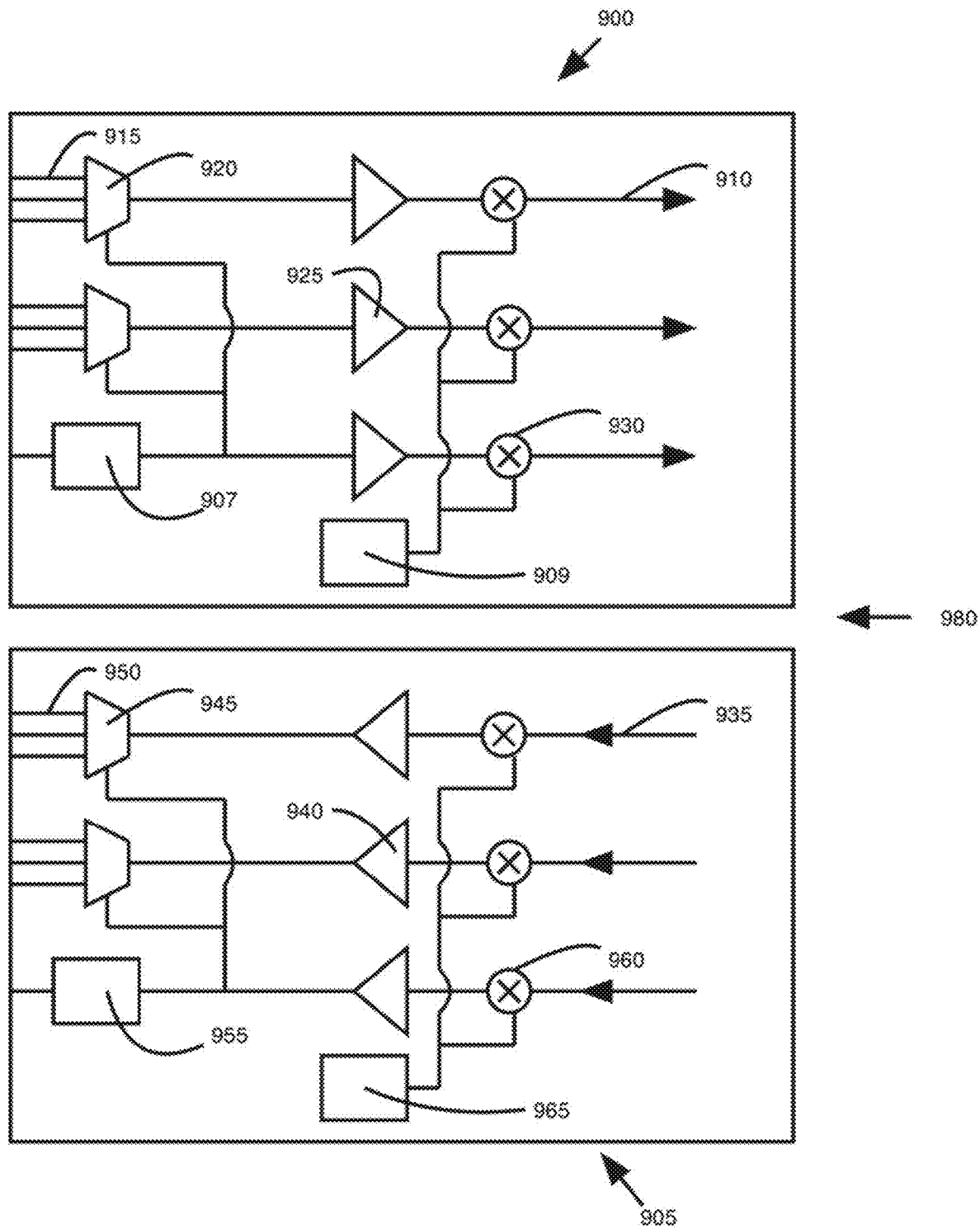
FIG. 12 depicts an alternative simplified view of a circuit design for a SerDes die, in accordance with various embodiments.

FIG. 12 depicts an alternative example of a wiring arrangement of a SerDes die. Specifically, in some embodiments, it may be preferable to modulate the signals using a carrier frequency. The carrier frequency may be on the order of between 20 and 100 gigahertz (GHz). This modulation may allow sending higher data rates through longer channels (e.g., long package transmission lines or printed circuit board (PCB) transmission lines). These embodiments, the signals may be modulated before transmission. Different modulation schemes may be used. For example, quadrature amplitude modulation (QAM), phase shift keying (PSK), amplitude shift keying (ASK), or some other modulation scheme may be used. The modulation schemed used may depend on properties such as channel characteristics, process technology, die area available, etc.

FIG. 12 depicts an embodiment of a SerDes die 980 that may be configured to modulate signals. The SerDes die 980 may include a transmit section 900 and a receive section 905, which may be similar to transmit section 800 and receive section 805, respectively. The transmit section 900 may include input wires 915, multiplexer 920, clock multiplier 907, driver 925, and output lines 910, which may be respectively similar to input wires 825, multiplexer 820, clock multiplier 830, driver 815, and output lines 810. The transmit section may further include a local oscillator 909 which may be configured to provide an oscillating signal to output wires 910. Specifically, the oscillating signal may be provided from local oscillator 909 to modulator 930, where the modulator 930 may combine the oscillating signal with the output serialized signal from the driver 925 to form a modulated serialized signal. The modulated serialized signal may then be output to, for example, a TSV such as TSV 165.

The receive section 905 may include, for example, input lines 935, receivers 940, demultiplexer 945, clock divider 955, and output lines 950, which may be respectively similar to input lines 835, receivers 840, demultiplexer 845, clock divider 855, and output lines 850. The receive section may further include a local oscillator 965, which may be communicatively coupled with demodulators 960. The local oscillator 965 may provide an oscillating signal to demodulators 960, which may use the oscillating signal to demodulate a modulated serialized signal received from the input lines 935.

The variations described above with respect to FIG. 11 may apply to the SerDes die 980 of FIG. 12. In addition, in some embodiments the transmit local oscillator 909 and the receive local oscillator 965 may need to be phase synchronized for phase-based modulation (e.g., QAM or PSK). This phase synchronization may be performed through a local filter to filter out the carrier frequency. Additionally, in some embodiments higher order modulation schemas (e.g., QAM, quadrature PSK (4PSK), etc.) may use two or more data bits to create modulated signals. These data bits may be referred to as "symbols." In this embodiment, one or more of the modulators 930 or demodulators 960 may be coupled with two or more data bits. In some embodiments, the modulators 930 and demodulators 960 may include additional elements such as a power splitter, a multiplier, a radio frequency (RF) filter, or an output amplifier.

Figure 14:
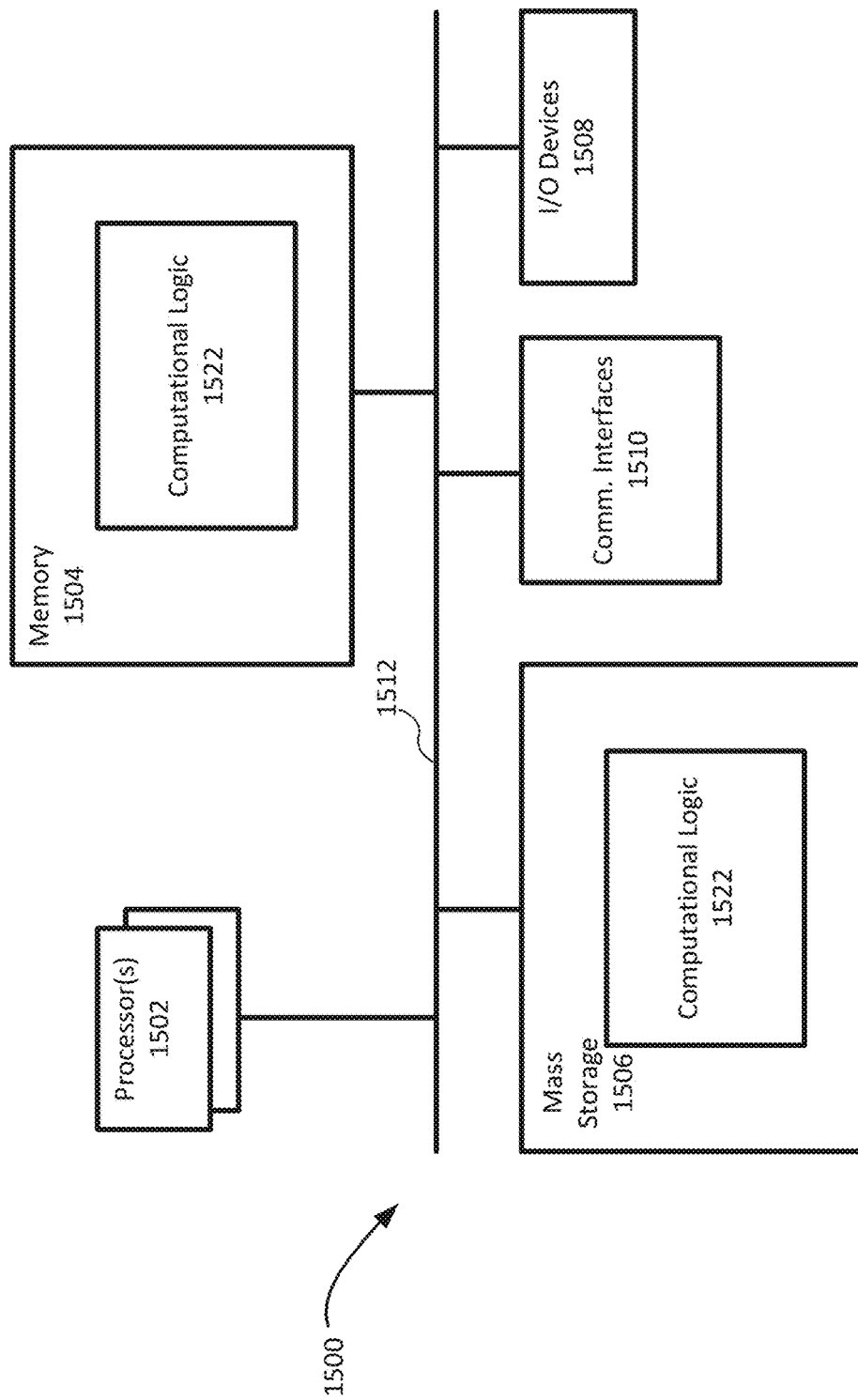
FIG. 14 illustrates an example device, in accordance with various embodiments.

FIG. 14 illustrates an example computing device 1500 suitable for use with packages 100, 200, 300, 400, 500, or 600, or some other package or device herein, in accordance with various embodiments. Specifically, in some embodiments, the computing device 1500 may include packages 100/200/300/400/500/600/etc. therein.

As shown, computing device 1500 may include one or more processors or processor cores 1502 and system memory 1504. For the purpose of this application, including the claims, the terms "processor" and "processor cores" may be considered synonymous, unless the context clearly requires otherwise. The processor 1502 may include any type of processors, such as a central processing unit (CPU), a microprocessor, and the like. The processor 1502 may be implemented as an integrated circuit having multi-cores, e.g., a multi-core microprocessor. The computing device 1500 may include mass storage devices 1506 (such as diskette, hard drive, volatile memory (e.g., dynamic random-access memory (DRAM), compact disc read-only memory (CD-ROM), digital versatile disk (DVD), and so forth). In general, system memory 1504 and/or mass storage devices 1506 may be temporal and/or persistent storage of any type, including, but not limited to, volatile and non-volatile memory, optical, magnetic, and/or solid state mass storage, and so forth. Volatile memory may include, but is not limited to, static and/or dynamic random-access memory. Non-volatile memory may include, but is not limited to, electrically erasable programmable read-only memory, phase change memory, resistive memory, and so forth.

The computing device 1500 may further include input/output (I/O) devices 1508 (such as a display (e.g., a touchscreen display), keyboard, cursor control, remote control, gaming controller, image capture device, and so forth) and communication interfaces 1510 (such as network interface cards, modems, infrared receivers, radio receivers (e.g., Bluetooth), and so forth). In some embodiments, the host device 103 may be elements of computing device 1500 such as processor(s) 1502, memory 1504, mass storage 1506, etc.

The communication interfaces 1510 may include communication chips (not shown) that may be configured to operate the device 1500 in accordance with a Global System for Mobile Communication (GSM), General Packet Radio Service (GPRS), Universal Mobile Telecommunications System (UMTS), High Speed Packet Access (HSPA), Evolved HSPA (E-HSPA), or Long-Term Evolution (LTE) network. The communication chips may also be configured to operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chips may be configured to operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication interfaces 1510 may operate in accordance with other wireless protocols in other embodiments.

The above-described computing device 1500 elements may be coupled to each other via system bus 1512, which may represent one or more buses. In the case of multiple buses, they may be bridged by one or more bus bridges (not shown). Each of these elements may perform its conventional functions known in the art. The various elements may be implemented by assembler instructions supported by processor(s) 1502 or high-level languages that may be compiled into such instructions.

The permanent copy of the programming instructions may be placed into mass storage devices 1506 in the factory, or in the field, through, for example, a distribution medium (not shown), such as a compact disc (CD), or through communication interface 1510 (from a distribution server (not shown)). That is, one or more distribution media having an implementation of the agent program may be employed to distribute the agent and to program various computing devices.

The number, capability, and/or capacity of the elements 1508, 1510, 1512 may vary, depending on whether computing device 1500 is used as a stationary computing device, such as a set-top box or desktop computer, or a mobile computing device, such as a tablet computing device, laptop computer, game console, or smartphone. Their constitutions are otherwise known, and accordingly will not be further described.

For one embodiment, at least one of processors 1502 may be packaged together with computational logic 1522 configured to practice aspects of optical signal transmission and receipt described herein to form a System in Package (SiP) or a System on Chip (SoC).

In various implementations, the computing device 1500 may comprise one or more components of a data center, a laptop, a netbook, a notebook, an ultrabook, a smartphone, a tablet, a personal digital assistant (PDA), an ultra mobile PC, a mobile phone, or a digital camera. In further implementations, the computing device 1500 may be any other electronic device that processes data.

In embodiments, various of the elements described with respect to computing device 1500 may be the dies 110/115/210/215/305/415/505/605/etc. of packages 100/200/300/400/500/600/etc. For example, in some embodiments the processor(s) 1502, the memory 1504, the computational logic 1522, or the communications interface 1510 may be one of the components dies 110/115/210/215/305/415/505/605.

EXAMPLES OF VARIOUS EMBODIMENTS

Example 1 includes a semiconductor package comprising: a first die; a second die; and a first serializer/deserializer (SerDes) die physically coupled with the first die and communicatively coupled with the second die, wherein the first SerDes die is to serialize signals transmitted from the first die to the second die, and the first SerDes die is to deserialize signals received from the second die.

Example 2 includes the semiconductor package of example 1, wherein the die is a monolithic die or a composite die.

Example 3 includes the semiconductor package of example 1, further comprising a second SerDes die physically coupled with the second die and communicatively coupled with the first SerDes die, wherein the second SerDes die is to serialize signals transmitted from the second die to the first die, and the second SerDes die is to deserialize signals received from the first die.

Example 4 includes the semiconductor package of any of examples 1-3, wherein the first SerDes die has first pads at a first pitch at a side of the SerDes die coupled with the first die, and the first SerDes die has second pads at a second pitch at a side of the SerDes die communicatively coupled with the second die.

Example 5 includes the semiconductor package of example 4, wherein the first pitch is larger than the second pitch.

Example 6 includes the semiconductor package of example 4, wherein the first pitch is between 5 micrometers and 20 micrometers.

Example 7 includes the semiconductor package of example 4, wherein the second pitch is between 20 micrometers and 200 micrometers.

Example 8 includes the semiconductor package of any of examples 1-3, wherein the second die is an interposer.

Example 9 includes the semiconductor package of any of examples 1-3, wherein the second die is a dual-sided interconnect die that includes an active component.

Example 10 includes the semiconductor package of example 9, wherein the active component is a transistor or a logic die.

Example 11 includes a method of forming a die with a serializer/deserializer (SerDes) die attached thereto, the method comprising: forming a first set of pads on a face of the die and a second set of pads on the face of the die, wherein the first set of pads have a first pitch and the second set of pads have a second pitch; attaching the SerDes die to the second set of pads, wherein the SerDes includes a plurality of through-silicon vias (TSVs); disposing a dielectric on the SerDes die and the face of the die to form an overmold; and grinding the overmold to expose the TSVs and the first set of pads.

Example 12 includes the method of example 11, further comprising coupling a pillar to a pad of the first set of pads.

Example 13 includes the method of example 12, further comprising adding, subsequent to the grinding, a redistribution layer (RDL) layer to the exposed TSVs or the pillars.

Example 14 includes the method of example 11, wherein the SerDes die is to serialize signals received from the die to form serialized signals, and the SerDes die is further to deserialize received signals to form deserialized signals and transmit the deserialized signals to the die.

Example 15 includes the method of example 14, wherein the die is a first die, and further comprising communicatively coupling the first die and the SerDes die to a second die so that the SerDes die is to transmit the serialized signals to the second die, and the SerDes die is further to receive the received signals from the second die.

Example 16 includes the method of any of examples 11-15, wherein the first pitch is larger than the second pitch.

Example 17 includes the method of any of examples 11-15, wherein attaching the SerDes die to the second set of pads includes soldering the SerDes die to the second set of pads, hybrid bonding the SerDes die to the second set of pads, or copper-to-copper attaching the SerDes die to the second set of pads.

Example 18 includes the method of any of examples 11-15, wherein the dielectric is a photo-resist material, a mold material, or a silica filled resin.

Example 19 includes the method of any of examples 11-15, wherein disposing the dielectric includes compression molding, transfer molding, spin coating, slit coating, or lamination.

Example 20 includes the method of any of examples 11-15, wherein grinding the overmold includes surface planarization or chemical mechanical polish (CMP).

Example 21 includes a semiconductor package comprising: a first die; and a serializer/deserializer (SerDes) die physically and communicatively coupled with the first die, wherein the SerDes die includes: a serializer module to demultiplex a plurality of signals received from the first die into a demultiplexed signal and output the demultiplexed signal via one or more pads of the SerDes die; and a deserializer module to multiplex a received signal received by the SerDes die into a plurality of multiplexed signals and output the plurality of multiplexed signals to the first die.

Example 22 includes the semiconductor package of example 21, further comprising a second die coupled with the first die, wherein the second die is communicatively coupled with the SerDes die.

Example 23 includes the semiconductor package of example 22, wherein the serializer module is to transmit the demultiplexed signal to the second die.

Example 24 includes the semiconductor package of example 22, wherein the deserializer module is to receive the received signal from the second die.

Example 25 includes the semiconductor package of any of examples 21-24, wherein the serializer module includes a local oscillator that is phase synchronized with a local oscillator of the deserializer module.

Example 26 includes the semiconductor package of any of examples 21-24, wherein the SerDes die is communicatively coupled with the first die by a control line.

Example 27 includes the semiconductor package of any of examples 21-24, wherein the SerDes module includes an internal memory.

Example 28 includes a computing system comprising: a first die with a first serializer/deserializer (SerDes) die physically and communicatively coupled with the first die by first pads with a first pitch; and a second die with a second SerDes die physically and communicatively coupled with the second die by second pads with the first pitch, wherein the first SerDes die is communicatively coupled with the second SerDes die.

Example 29 includes the computing system of example 28, wherein the first SerDes die includes third pads with a second pitch that is smaller than the first pitch, the second SerDes die includes fourth pads with the second pitch, and the third pads are communicatively coupled with the fourth pads.

Example 30 includes the computing system of example 28, wherein the first SerDes die has a z-height between 50 micrometers and 100 micrometers as measured in a direction perpendicular to a face of the first die adjacent to the first SerDes die.

Example 31 includes the computing system of example 28, wherein the first SerDes die has a z-height between 10 micrometers and 20 micrometers as measured in a direction perpendicular to a face of the first die adjacent to the first SerDes die.

Example 32 includes the computing system of any of examples 28-31, wherein the first SerDes die is at least partially positioned in a cavity of the second die.

Example 33 includes the computing system of any of examples 28-31, wherein the first SerDes die is communicatively coupled with the second die by a main die routing line of the first die.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations of the various embodiments, including what is described in the Abstract, is not intended to be exhaustive or to limit the invention to the precise forms disclosed. While specific implementations of, and examples for, various embodiments are described herein for illustrative purposes, various equivalent modifications are possible within the scope of the invention, as those skilled in the relevant art will recognize. These modifications may be made in light of the above detailed description. The terms used in the following claims should not be construed to limit this disclosure to the specific embodiments disclosed in the specification and the claims.

The invention claimed is:

1. A semiconductor package comprising:
a substrate having a conductive pathway;
a first die electrically coupled to the substrate by a plurality of first pillars having a first pitch;
a first serializer/deserializer (SerDes) die having a first surface with first conductive pads and an opposing second surface with second conductive pads, wherein the first conductive pads of the first SerDes die are coupled to the conductive pathway of the substrate by first interconnects and the second conductive pads of the first SerDes die are coupled to the first die by second interconnects having a second pitch, and wherein the second pitch is smaller than the first pitch;
a second die electrically coupled to the substrate by a plurality of second pillars; and
a second SerDes die having a third surface with third conductive pads and an opposing fourth surface with fourth conductive pads, wherein the third conductive pads of the second SerDes die are coupled to the conductive pathway of the substrate by third interconnects and the fourth conductive pads of the second SerDes die are coupled to the second die by fourth interconnects, and wherein the first die is communicatively coupled with the second die via the first SerDes die, the conductive pathway in the substrate, and the second SerDes die.

2. The semiconductor package of claim 1, wherein the first die or the second die is a monolithic die or a composite die.

3. The semiconductor package of claim 1, wherein the first pitch is between 20 microns and 200 microns.

4. The semiconductor package of claim 1, wherein the second pitch is between 5 microns and 150 microns.

5. The semiconductor package of claim 1, wherein the substrate is an interposer.

6. The semiconductor package of claim 1, wherein the substrate is a dual-sided interconnect die that includes an active component.

7. A semiconductor package comprising:
a substrate including a conductive pathway;
a first die electrically coupled to the substrate by a plurality of first pillars having a first pitch;
a first serializer/deserializer (SerDes) die having a first surface and an opposing second surface, wherein the first surface of the first SerDes die is electrically coupled to the conductive pathway of the substrate and the second surface of the first SerDes die is electrically coupled to the first die by interconnects having a second pitch, wherein the second pitch is smaller than the first pitch, and wherein the first SerDes die includes:
a first serializer module configured to demultiplex a plurality of signals received from the first die into a demultiplexed signal and output the demultiplexed signal via one or more pads of the first SerDes die; and
a first deserializer module configured to multiplex a signal received by the first SerDes die into a plurality of multiplexed signals and output the plurality of multiplexed signals to the first die;

a second die electrically coupled to the substrate by a plurality of second pillars;
a second SerDes die having a first surface and an opposing second surface, wherein the first surface of the second SerDes die is electrically coupled to the conductive pathway of the substrate and the second surface of the second SerDes die is electrically coupled to the second die, wherein the second SerDes die includes:
a second serializer module configured to demultiplex a plurality of signals received from the second die into a demultiplexed signal and output the demultiplexed signal via one or more pads of the second SerDes die; and
a second deserializer module configured to multiplex a signal received by the second SerDes die into a plurality of multiplexed signals and output the plurality of multiplexed signals to the second die; and
wherein the first die is communicatively coupled with the second die via the first SerDes die, the conductive pathway in the substrate, and the second SerDes die-.

8. The semiconductor package of claim 7, wherein the first serializer module includes a first local oscillator and the first deserializer module includes a second local oscillator, and wherein the first local oscillator of the first serializer module is phase synchronized with the second local oscillator of the first deserializer module.

* * * * *

UNITED STATES PATENT AND TRADEMARK OFFICE
CERTIFICATE OF CORRECTION

| | |
|---|---|
| PATENT NO. | : 11,581,282 B2 |
| APPLICATION NO. | : 16/117353 |
| DATED | : February 14, 2023 |
| INVENTOR(S) | : Adel A. Elsherbini et al. |

It is certified that error appears in the above-identified patent and that said Letters Patent is hereby corrected as shown below:

In the Claims

In Column 20, Claim 7, Line 20, delete "die-." and insert -- die. --, therefor.

Signed and Sealed this
Twenty-first Day of March, 2023

*Katherine Kelly Vidal*

Katherine Kelly Vidal
*Director of the United States Patent and Trademark Office*